(12) United States Patent
Yutani et al.

(10) Patent No.: US 8,598,570 B2
(45) Date of Patent: Dec. 3, 2013

(54) ORGANIC TRANSISTOR ARRAY, DISPLAY DEVICE AND METHOD OF FABRICATING DISPLAY DEVICE

(75) Inventors: Keiichiro Yutani, Kanagawa (JP);
Takumi Yamaga, Kanagawa (JP);
Atsushi Onodera, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 848 days.

(21) Appl. No.: 12/490,641

(22) Filed: Jun. 24, 2009

(65) Prior Publication Data

US 2009/0321727 A1 Dec. 31, 2009

(30) Foreign Application Priority Data

Jun. 25, 2008 (JP) .................................. 2008-166329

(51) Int. Cl.
*H01L 29/08* (2006.01)
*H01L 35/24* (2006.01)
*H01L 51/00* (2006.01)

(52) U.S. Cl.
USPC ................... 257/40; 257/59; 257/69; 257/72; 257/E27.001; 257/E27.13; 257/E27.132; 257/E51.001; 438/34; 438/82; 438/99; 349/42; 349/43; 349/46; 349/47; 349/56; 345/92; 345/695

(58) Field of Classification Search
USPC ............ 257/40, 59, 69, 72, E27.001, E27.13, 257/E27.132, E51.001; 438/34, 82, 99; 349/42, 43, 46, 47, 56, FOR. 111; 345/695, 92
See application file for complete search history.

(56) References Cited

U.S. PATENT DOCUMENTS

| | | | |
|---|---|---|---|
| 5,144,288 | A | 9/1992 | Hamada et al. |
| 5,146,356 | A | 9/1992 | Carlson |
| 2003/0136966 | A1 | 7/2003 | Inoue et al. |
| 2004/0238816 | A1 | 12/2004 | Tano et al. |
| 2005/0282304 | A1 | 12/2005 | Inoue et al. |
| 2009/0072734 | A1 | 3/2009 | Harada et al. |
| 2009/0224663 | A1 | 9/2009 | Inoue et al. |

FOREIGN PATENT DOCUMENTS

| | | |
|---|---|---|
| EP | 0158366 A2 | 10/1985 |
| EP | 0498498 A2 | 8/1992 |
| EP | 1450587 A1 | 8/2004 |
| EP | 1868246 A1 | 12/2007 |
| JP | 4-086808 | 3/1992 |
| JP | 9-325367 | 12/1997 |
| JP | 2005-310962 | 11/2005 |
| JP | 2007-36259 | 2/2007 |
| JP | 2007-110048 | 4/2007 |
| WO | WO2008/015947 A1 | 2/2008 |

OTHER PUBLICATIONS

Oct. 28, 2009 European search report in connection with a counterpart European patent application No. 09 25 1639.
Chu, Chih-Wei, et al., "Integration of organic light-emitting diode and organic transistor via a tandem structure," *Applied Physics Letters*, vol. 86, No. 25, pp. 253503-1 to 253503-3 (Jun. 14, 2005).
Okubo, T., et al., "10.5-in. VGA All-printed Flexible Organic TFT Backplane for Electrophoretic Displays", AMD5-4L, IDW '07, pp. 463-464.
Japanese official action dated Feb. 12, 2013 in corresponding Japanese patent application No. 2008-166329.

*Primary Examiner* — Meiya Li
(74) *Attorney, Agent, or Firm* — Cooper & Dunham LLP

(57) ABSTRACT

An organic transistor array includes gate electrodes provided on a substrate, source and drain electrodes provided above or below the gate electrodes via a gate insulator layer, and an organic semiconductor layer opposing the gate electrodes via the gate insulator layer, and forming a channel region between mutually adjacent source and drain electrodes. The organic transistor array in a plan view is sectioned into sections each forming a single pixel, and each section has a closest packed structure.

18 Claims, 16 Drawing Sheets

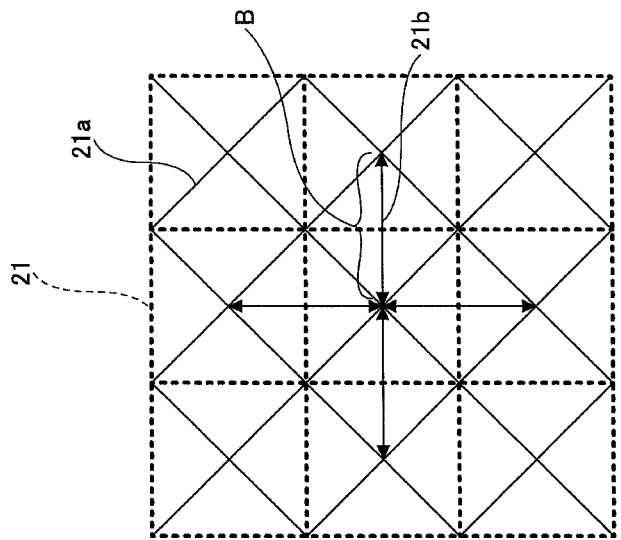
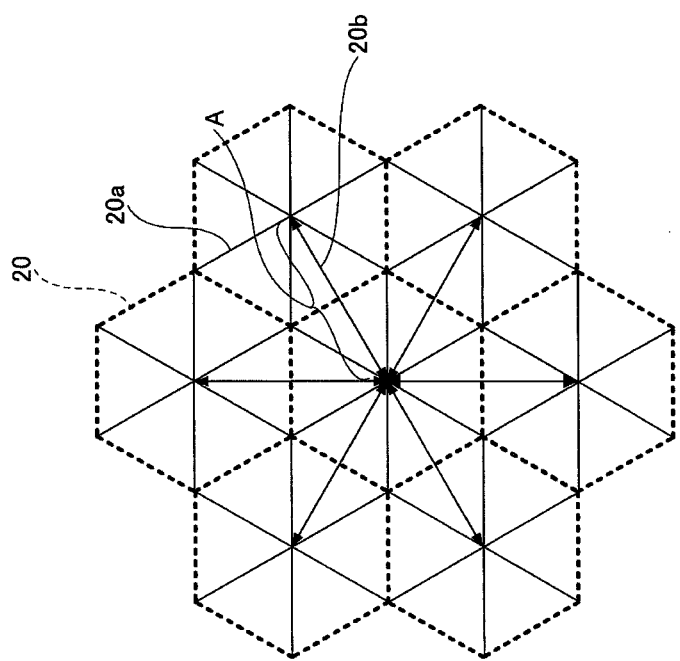

ORGANIC TRANSISTOR ARRAY, DISPLAY DEVICE AND METHOD OF FABRICATING DISPLAY DEVICE

CROSS-REFERENCE TO RELATED APPLICATION

This application claims the benefit of Japanese Patent Application No. 2008-166329, filed Jun. 25, 2008 in the Japanese Patent Office, the disclosure of which is hereby incorporated by reference in its entirety.

BACKGROUND OF THE INVENTION

1. Field of the Invention

The present invention relates to organic transistor arrays, display devices and methods of fabricating display devices.

2. Description of the Related Art

Recently, there is active research related to organic thin film transistors (or TFTs) using an organic material. The organic thin film transistors have the following features. First, the flexibility with which the materials, fabricating method and product configuration usable by the organic thin film transistor is high. Second, the organic thin film transistor can be arranged in a large area. Third, the organic thin film transistor has a simple layer structure and can be fabricated by a simple fabricating process. Fourth, the organic thin film transistor can be fabricated by an inexpensive fabricating apparatus.

An electrode, an insulator layer, an organic semiconductor layer and the like forming the organic thin film transistor may be formed by methods such as printing, spin-coating and dipping. Hence, the organic thin film transistor can be fabricated at a cost considerably lower than that of a conventional thin film transistor using a semiconductor material such as silicon.

A display device can be obtained by fabricating an organic thin film transistor array in which the organic thin film transistors are integrated, and driving display elements using the organic thin film transistor array. Such a display device has a newly added value including the characteristics of the organic thin film transistors. For example, T. Okubo et al., "10.5-in. VGA All-printed Flexible organic TFT Backplane for Electrophoretic Displays", AMD5-4L, IDW '07, pp. 463-464 proposes a flexible display device that is fabricated by combining an organic thin film transistor array fabricated by the printing process with an electrophoretic element. Such a flexible display device is suited for a display panel on a curved wall or a portable display, and is uneasily damaged when dropped. In addition, the fabrication cost can be suppressed by employing the printing process.

In order to improve the display quality of the display device described above, it is important to improve the pixel density. It is necessary to improve the integration density of the organic thin film transistor array that is used to drive the display elements. When integrating the organic thin film transistor array, it is necessary to pattern electrodes and organic semiconductor layers. For this reason, in order to improve the display quality of the display device, it is necessary to develop a patterning technique which can finely pattern the electrodes and the organic semiconductor layers forming the organic thin film transistor array.

Generally, the most simple conventional organic thin film transistor array has signal lines and selection lines that are perpendicular to each other, and a section of a single pixel including the organic thin film transistor has a rectangular shape. However, the existing organic thin film transistor array does not have a sufficiently high integration density because the patterning accuracy of the printing process is poor. For example, when patterning the electrode, the organic thin film transistor may malfunction due to a short-circuiting of the electrodes if the patterning accuracy of the printing process is poor.

On the other hand, a Japanese Laid-Open Patent Publication No. 2005-310962 proposes a method of fabricating a stacked structure, including forming a wettability varying layer that includes a material whose critical surface tension varies when energy is applied thereto, forming portions having different critical surface tensions including a low surface energy portion having a low critical surface tension and a high surface energy portion having a high critical surface tension by applying energy to a portion of the wettability varying layer, forming a conductor layer on the high surface energy portion by applying a liquid that includes a conductor material on the surface of the wettability varying layer, and forming an organic semiconductor layer on the wettability varying layer.

However, when patterning the organic semiconductor layer, for example, the organic semiconductor layer is formed at a portion other than a channel portion of the organic thin film transistor if the patterning accuracy of the printing process is poor. As a result, the organic thin film transistor may malfunction due to a deterioration in the contrast ratio caused by an increase in an off leak current or a crosstalk between the adjacent organic thin film transistors. The off leak current refers to the current that leaks even when the circuit or device is in an off state or standby state.

On the other hand, the Japanese Laid-Open Patent Publication No. 2007-36259 proposes a method of fabricating the organic thin film transistor by forming a barrier around the channel portion and patterning the organic semiconductor layer. But according to this proposed method, the number of fabrication processes increases, to thereby deteriorate the throughput and increase the fabrication cost.

Known patterning methods include the ink jet method and the dispenser method. The ink jet method and the dispenser method directly plot the patterns, and thus, these methods can considerably improve the material utilization efficiency. When the organic semiconductor layer is formed by the ink jet method or the dispenser method, it may be possible to simplify the fabrication process, improve the yield, and reduce the fabrication cost. When a polymer material soluble in an organic solvent is used as the organic semiconductor material, it is possible to adjust the solution (organic semiconductor ink) of the organic semiconductor material, and thus, the patterns of the organic semiconductor layer can be formed by the ink jet method.

However, the spreading of the ink drop or, the inconsistent landing of the ink drops of the organic semiconductor ink on a target surface may cause problems. As the integration density of the organic thin film transistor improves, the ink drop forming density increases, and the ink drop is greatly affected by the solvent atmosphere after the ink drop lands on the target surface, thereby making the ink drop drying time longer. That is, the ink drop of the organic semiconductor ink after landing on the target surface more easily spreads as the integration density of the organic thin film transistor improves. As a result, it becomes difficult to control the patterns of the organic semiconductor layer.

In addition, when the electrode is printed using the ink jet method using Ag ink, for example, there is a limit in reducing the pattern size if the printing accuracy is taken into consideration. Hence, the organic thin film transistor and the organic thin film transistor array in which the organic thin film transistors are integrated need to be formed by taking into consideration the spreading of the ink and the inconsistent landing of the ink drops on the target surface, but it is difficult to reduce the pattern size while maintaining the required printing accuracy.

Therefore, although various techniques have been proposed with respect to the organic thin film transistors (TFTs), there has yet to be proposed a technique that can improve the integration density of the organic thin film transistor array employing the existing printing process without increasing the number of fabrication processes.

SUMMARY OF THE INVENTION

Accordingly, it is a general object of the present invention to provide a novel and useful organic transistor array, display device and method of fabricating display device, in which the problems described above are suppressed.

It is one object in one aspect of the present invention to provide an organic transistor array, a display device and a method of fabricating display device, that can improve the integration density of the organic transistor array employing the existing printing process without increasing the number of fabrication processes.

According to one aspect of the present invention, there is provided an organic transistor array comprising a plurality of gate electrodes provided on a substrate surface; a plurality of source electrodes and a plurality of drain electrodes provided above or below the plurality of gate electrodes via a gate insulator layer; and an organic semiconductor layer opposing the plurality of gate electrodes via the gate insulator layer, and forming a channel region between mutually adjacent source and drain electrodes, wherein the organic transistor array in a plan view viewed in a direction perpendicular to the substrate surface is sectioned into a plurality of sections each forming a single pixel, and each of the sections has a closest packed structure.

According to one aspect of the present invention, there is provided a display device comprising an organic transistor array comprising a plurality of gate electrodes provided on a substrate surface of a first substrate; a plurality of source electrodes and a plurality of drain electrodes provided above or below the plurality of gate electrodes via a gate insulator layer; and an organic semiconductor layer opposing the plurality of gate electrodes via the gate insulator layer, and forming a channel region between mutually adjacent source and drain electrodes, wherein the organic transistor array in a plan view viewed in a direction perpendicular to the substrate surface is sectioned into a plurality of sections each forming a single pixel, and each of the sections has a closest packed structure; and a second substrate bonded on a surface of the organic transistor array opposite from the first substrate, and comprising a plurality of display elements and a transparent conductor layer provided on the plurality of display elements opposite the first substrate.

According to one aspect of the present invention, there is provided a method of fabricating a display device, comprising forming a plurality of gate electrodes on a substrate surface of a first substrate; forming a plurality of source electrodes and a plurality of drain electrodes above or below the plurality of gate electrodes via a gate insulator layer; forming an organic semiconductor layer opposing the plurality of gate electrodes via the gate insulator layer, to form a channel region between mutually adjacent source and drain electrodes, in order to fabricate an organic transistor array comprising the first substrate, the gate, source and drain electrodes, and the gate insulator layer, wherein the organic transistor array in a plan view viewed in a direction perpendicular to the substrate surface is sectioned into a plurality of sections each forming a single pixel, and each of the sections has a closest packed structure; and bonding a second substrate on a surface of the organic transistor array opposite from the first substrate, the second substrate comprising a plurality of display elements and a transparent conductor layer provided on the plurality of display elements opposite the first substrate, wherein at least one of the gate, source and drain electrodes is formed by printing ink which includes metal particles or metal complexes.

Other objects and further features of the present invention will be apparent from the following detailed description when read in conjunction with the accompanying drawings.

BRIEF DESCRIPTION OF THE DRAWINGS

FIGS. 4A and 4B respectively are diagrams illustrating a section forming a single pixel in the organic thin film transistor array of the first embodiment of the present invention and a section forming a single pixel in a conventional organic thin film transistor array;

DESCRIPTION OF THE PREFERRED EMBODIMENTS

Figure 1:
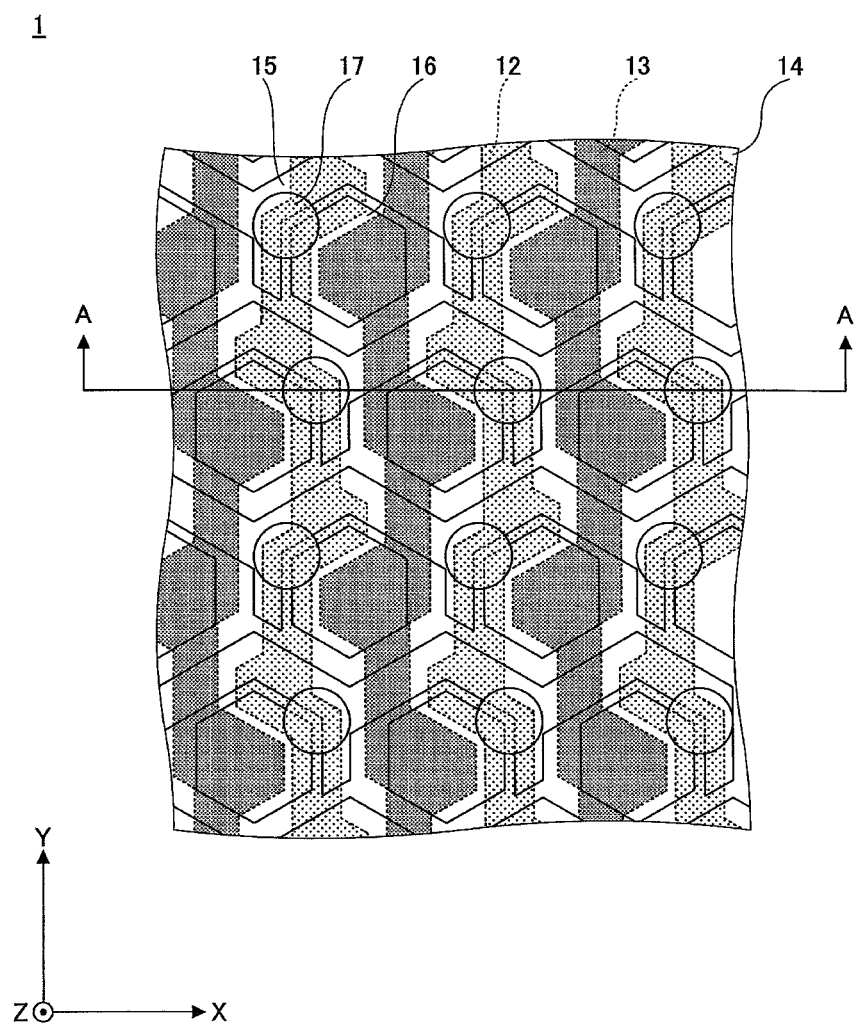
FIG. 1 is a plan view illustrating an example of an organic thin film transistor array in a first embodiment of the present invention.

A description will be given of embodiments of embodiments of the organic transistor array, the display device and the method of fabricating display device according to the present invention, by referring to the drawings.

First Embodiment

Figure 2:
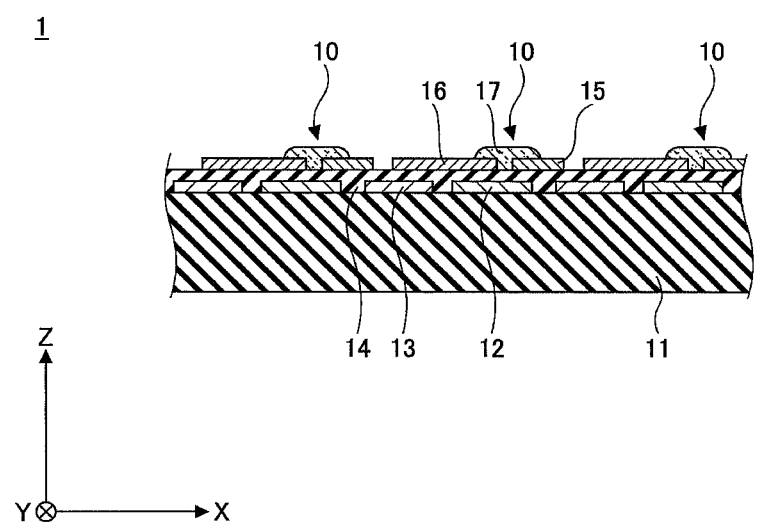
FIG. 2 is a cross sectional view along a line A-A in FIG. 1 illustrating the example of the organic thin film transistor array in the first embodiment of the present invention.

FIG. 1 is a plan view illustrating an example of an organic thin film transistor array in a first embodiment of the present invention. FIG. 2 is a cross sectional view along a line A-A in FIG. 1 illustrating the example of the organic thin film transistor array in the first embodiment of the present invention. As illustrated in FIGS. 1 and 2, an organic thin film transistor array 1 includes a plurality of organic thin film transistors 10. The organic thin film transistor 10 includes a substrate 11, a gate electrode 12, a ground electrode 13, a gate insulator layer 14, a source electrode 15, a drain electrode 16, and an organic semiconductor layer 17.

In the organic thin film transistor 10, the gate electrode 12 and the ground electrode 13 are formed on the substrate 11 at a predetermined distance from each other. The gate insulator layer 14 is formed to cover the gate electrode 12 and the ground electrode 13. The source electrode 15 and the drain electrode 16 are formed on the gate insulator layer 14 at a predetermined distance from each other.

The source electrode 15 and the drain electrode 16 are formed at a position such that a region (channel region) sandwiched between the source electrode 15 and the drain electrode 16 overlaps the gate electrode 12 via the gate insulator layer 14. The organic semiconductor layer 17 is formed so as to cover the region (channel region) sandwiched between the source electrode 15 and the drain electrode 16. The gate electrode 12, the source electrode 15, the drain electrode 16, and the organic semiconductor layer 17 may be formed by a printing method such as the ink jet method. A bonding layer (not illustrated) made of Cr or the like may be formed on the substrate 11, and in this case, the gate electrode 12 and the ground electrode 13 is formed on the bonding layer.

Figure 3:
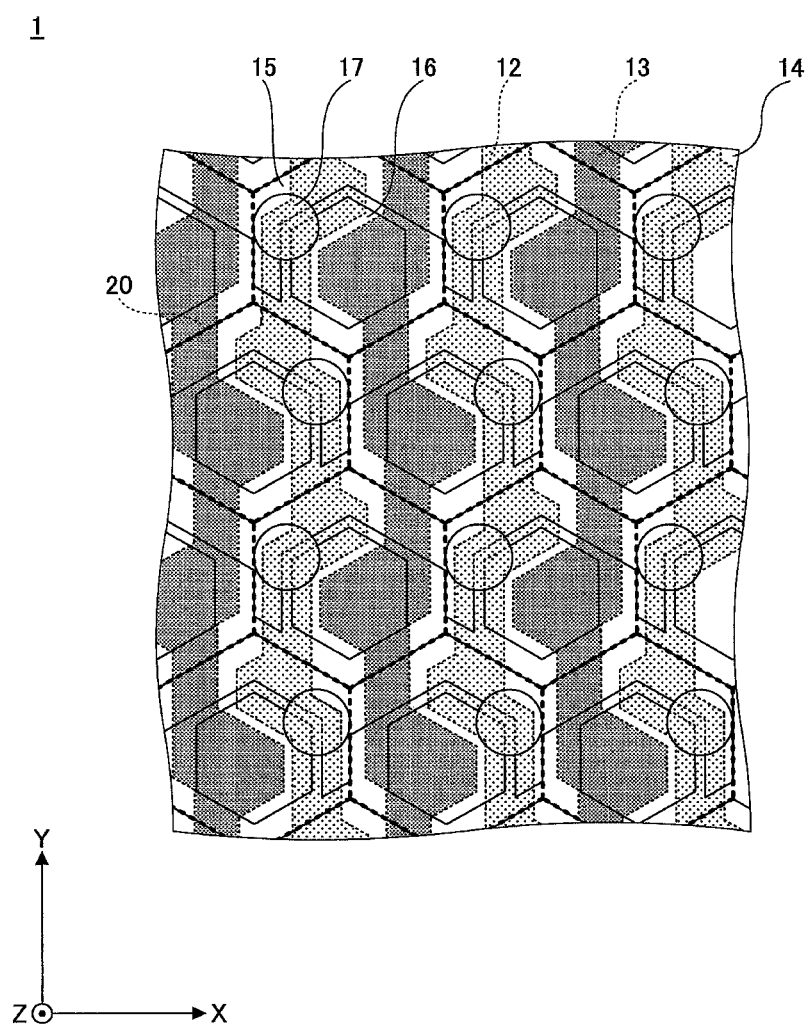
FIG. 3 is a plan view illustrating a section forming a single pixel of the organic thin film transistor array in the first embodiment of the present invention.

FIG. 3 is a plan view illustrating a section forming a single pixel of the organic thin film transistor array in the first embodiment of the present invention. In FIG. 3, those parts that are the same as those corresponding parts in FIGS. 1 and 2 are designated by the same reference numerals, and a description thereof will be omitted. FIG. 3 illustrates a section 20. As illustrated in the plan view of FIG. 3, which is viewed in a direction perpendicular to a surface of the substrate 11 (that is, the substrate surface), the organic thin film transistor array 1 is sectioned into a plurality of sections 20 each forming a single pixel. The section 20 has a geometrically closest packed structure, that is, a hexagonal shape in the plan view. In addition, the sections 20 are arranged in a checker board pattern along a direction Y in the plan view. The plan view is the state of the organic thin film transistor array 1 viewed from a positive direction Z in FIG. 2.

The section 20 of the organic thin film transistor array 1 forms the single pixel, and includes the single organic thin film transistor 10 having the gate electrode 12, the ground electrode 13, the gate insulator layer 14, the source electrode 15, the drain electrode 16 and the organic semiconductor layer 17. The section 20 is defined by a minimum constituent unit of the repeating structure in the organic thin film transistor array 1. As long as the positional relationship is satisfied such that the sections 20 of the organic thin film transistor array 1 are formed into the regular hexagonal shape, the gate electrode 12, the ground electrode 13, the source electrode 15, the drain electrode 16 and the organic semiconductor layer 17 may be printed by the printing method at arbitrary positions.

The section 20 has the regular hexagonal shape according to the design. However, in the organic thin film transistor array 1 that is actually formed, the dimensions may not become as designed due to the fabrication accuracy or the like, and in such a case, the section 20 may not become exactly the regular hexagonal shape, that is, may become an approximately regular hexagonal shape. Effects of this embodiment may be obtained even when the section 20 has the approximately regular hexagonal shape.

When the organic thin film transistor array 1 forms a display device, display elements are provided on the organic thin film transistor array 1. In a region of the display element corresponding to the section 20, a pixel electrode electrically connecting to the drain electrode 16, an interlayer insulator electrically insulating the pixel electrode from the organic semiconductor layer 17, and the like may be formed.

FIG. 4A is a diagram illustrating a section forming a single pixel in the organic thin film transistor array of this first embodiment of the present invention, and FIG. 4B is a diagram illustrating a section forming a single pixel in a conventional organic thin film transistor array, to be used for comparison with FIG. 4A.

In FIG. 4A, the section 20 forming the single pixel of the organic thin film transistor array 1 in this first embodiment of the present invention has the hexagonal shape. An extension line 20a connects mutually confronting vertexes of the hexagonal shape forming the section 20. An extension line 20b connects centers of mutually adjacent sections 20. In FIG. 4A, A denotes a length of each extension line 20b, that is, a pattern pitch.

In FIG. 4B, a section 21 forming a single pixel of the conventional organic thin film transistor array has a rectangular shape. An extension line 21a connects mutually confronting vertexes of the rectangular shape forming the section 21. An extension line 21b connects centers of mutually adjacent sections 21. In FIG. 4B, B denotes a length of each extension line 21b, that is, a pattern pitch.

The area of the section 20 in FIG. 4A is the same as the area of the section 21 in FIG. 4B. When FIGS. 4A and 4B are compared, it may be seen that the pattern pitch A, which is a repetition period for the case where the sections 20 are integrated, is longer than the pattern pitch B, which is a repetition period for a case where the sections 21 are integrated. Because the hexagonal shape has the geometrically closest packed structure, the sections 20 illustrated in FIG. 4A have an advantage over the sections 21 illustrated in FIG. 4B in that the sections 20 have a longer repetition period of the patterns with respect to the resolution.

Accordingly, by employing the structure illustrated in FIG. 4A, the interval between the gate electrode 12 and the ground electrode 13 that are formed at the same layer and the interval between the source electrode 15 and the drain electrode 16 that are formed at the same layer can be made longer, thereby making it possible to suppress the problem of adjacent electrodes becoming short-circuited when the above electrodes are formed by the printing process. In addition, because the pattern pitch A is long compared to the pattern pitch B, it is possible to employ an electrode structure that takes into consideration the spreading of the ink drop or, the inconsistent landing of the ink drops of the organic semiconductor ink forming the organic semiconductor layer 17 on a target surface. In other words, the organic semiconductor layer 17 can be suppressed from being formed in regions other than the desired region, and it is possible to suppress a deterioration in the contrast ratio caused by an increase in an off leak current or a crosstalk between the adjacent organic thin film transistors 10. The off leak current refers to the current that leaks even when the circuit or device is in an off state or standby state. Furthermore, in a case where the pattern pitch A and the pattern pitch B are the sake, it is possible to improve the resolution according to the structure illustrated in FIG. 4A because of the hexagonal shape of the sections 20.

Figure 5A:
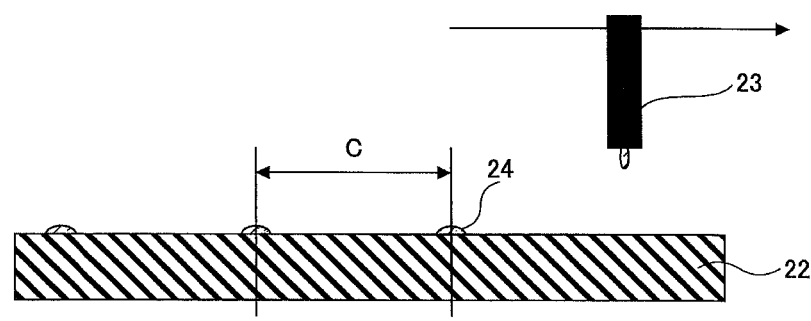
FIGS. 5A, 5B and 5C are cross sectional views illustrating patterning by the ink jet method.
Figure 5B:
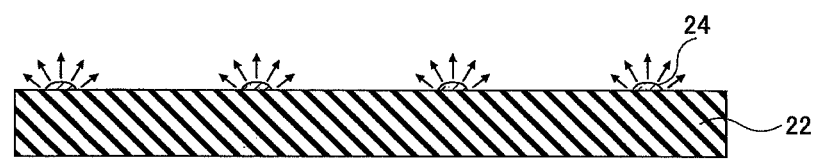
Figure 5C:
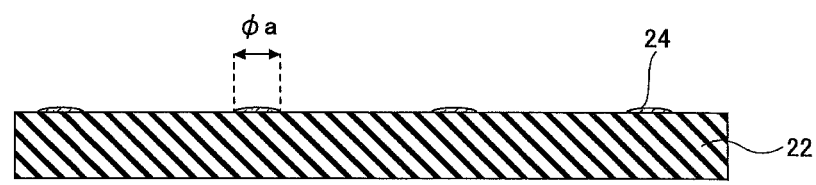
Figure 6A:
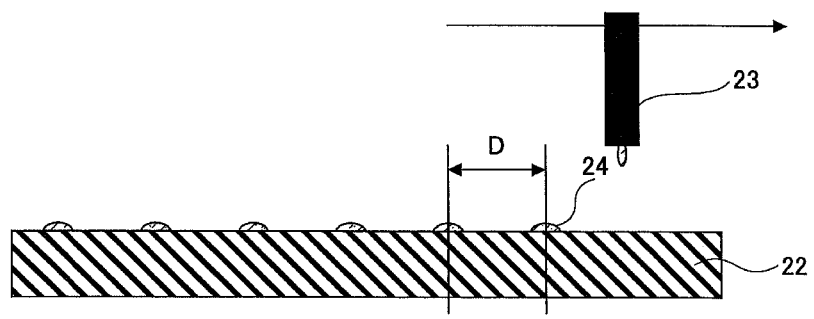
FIGS. 6A, 6B and 6C are cross sectional views illustrating the patterning by the ink jet method.

FIGS. 5A, 5B and 5C and FIGS. 6A, 6B and 6C are cross sectional views illustrating patterning by the ink jet method. In FIGS. 5A and 6A, an arrow IJ indicate a head scan direction in which an ink jet head provided with a nozzle 23 makes a scan. The illustration of the arrow IJ is omitted in FIGS. 5B, 5C, 6B and 6C.

Figure 6B:
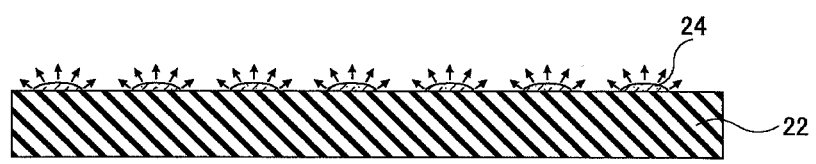
Figure 6C:
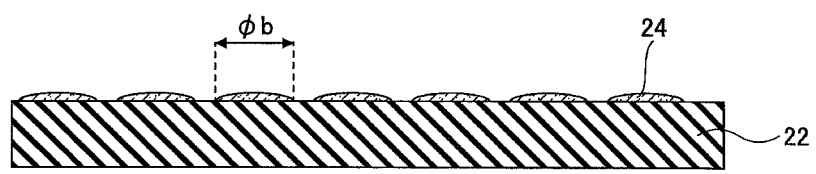

FIGS. 5A through 5C illustrate an example where ink drops 24 are successively dropped from the nozzle 23 onto a substrate 22 at a pattern pitch C. FIGS. 6A through 6C illustrate an example where the ink drops 24 are successively dropped from the nozzle 23 onto the substrate 22 at a pattern pitch D which is narrower than the pattern pitch C. FIGS. 5A and 6A illustrate a state immediately after the ink drops 24 land on the substrate 22. FIGS. 5B and 6B illustrate a state where the ink drops 24 on the substrate 22 are being dried. FIGS. 5C and 6C illustrate a state where the ink drops 24 on the substrate 22 have been dried. In FIGS. 5B and 6B, arrows schematically illustrate the drying of the ink drops 24.

According to the ink jet method, which is a kind of printing method, the ink drop 24 which drops from the nozzle 23 onto a desired position on the substrate 22 spreads after landing on the substrate 22 until the ink drop 24 is dried. The drying of the ink drop 24 is affected by the solvent atmosphere of the ink drop 24 that lands in a periphery thereof. For this reason, if the pattern pitch C is set wide as illustrated in FIGS. 5A through 5C, the ink drop 24 dries more easily after landing on the substrate 22, and the spreading of the ink drop 24 during the drying can be suppressed. As a result, a maximum diameter φa of the ink drop 24 in FIG. 5C does not become very large.

On the other hand, if the pattern pitch D is narrow as illustrated in FIGS. 6A through 6C, the ink drop 24 does not easily dry after landing on the substrate 22, and the spreading of the ink drop 24 during the drying cannot be suppressed. As a result, a maximum diameter φb of the ink drop 24 in FIG. 6C becomes large compared to the maximum diameter pa of the ink drop 24 illustrated in FIG. 5C. The maximum diameters φa and φb both indicate the diameter of the ink drop 24 in the plan view. For example, the maximum diameter is the diameter of the ink drop 24 at the time of the drying if the ink drop 24 has a circular shape in the plan view, and the maximum diameter of the ink drop 24 is the major axis of the ink drop 24 at the time of the drying if the ink drop 24 has an elliptical (or oval) shape in the plan view.

Therefore, when the pattern pitch C is set wide in this manner, the time it takes for the ink drop 24 to dry after landing on the substrate 22 becomes short. Consequently, it is possible to suppress the spreading of the ink drop 24 after landing on the substrate 22, and to reduce the maximum diameter φa of the ink drop 24 at the time of drying.

Figure 7:
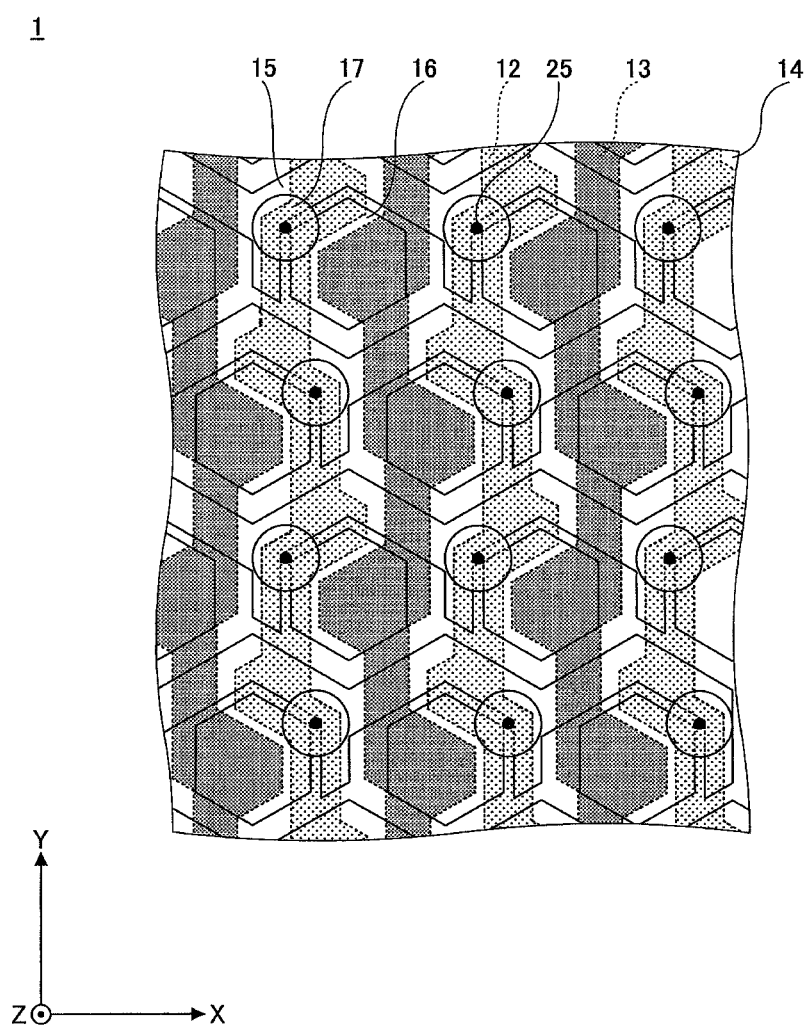
FIG. 7 is a plan view illustrating a center position of a channel region in the organic thin film transistor array in the first embodiment of the present invention.

FIG. 7 is a plan view illustrating a center position of a channel region in the organic thin film transistor array in the first embodiment of the present invention. In FIG. 7, those parts that are the same as those corresponding parts in FIGS. 1 and 2 are designated by the same reference numerals, and a description thereof will be omitted. In FIG. 7, an approximate center position of the channel region is denoted by a reference numeral 25. As described above, the section 20 of the organic thin film transistor array 1 in this first embodiment of the present invention has a geometrically closest packed structure, that is, a hexagonal shape in the plan view. In addition, the sections 20 are arranged in a checker board pattern along the direction Y in the plan view. Hence, the center positions 25 of the channel regions each sandwiched between the source electrode 15 and the drain electrode 16 are not aligned along a single straight line in the direction Y.

Figure 8:
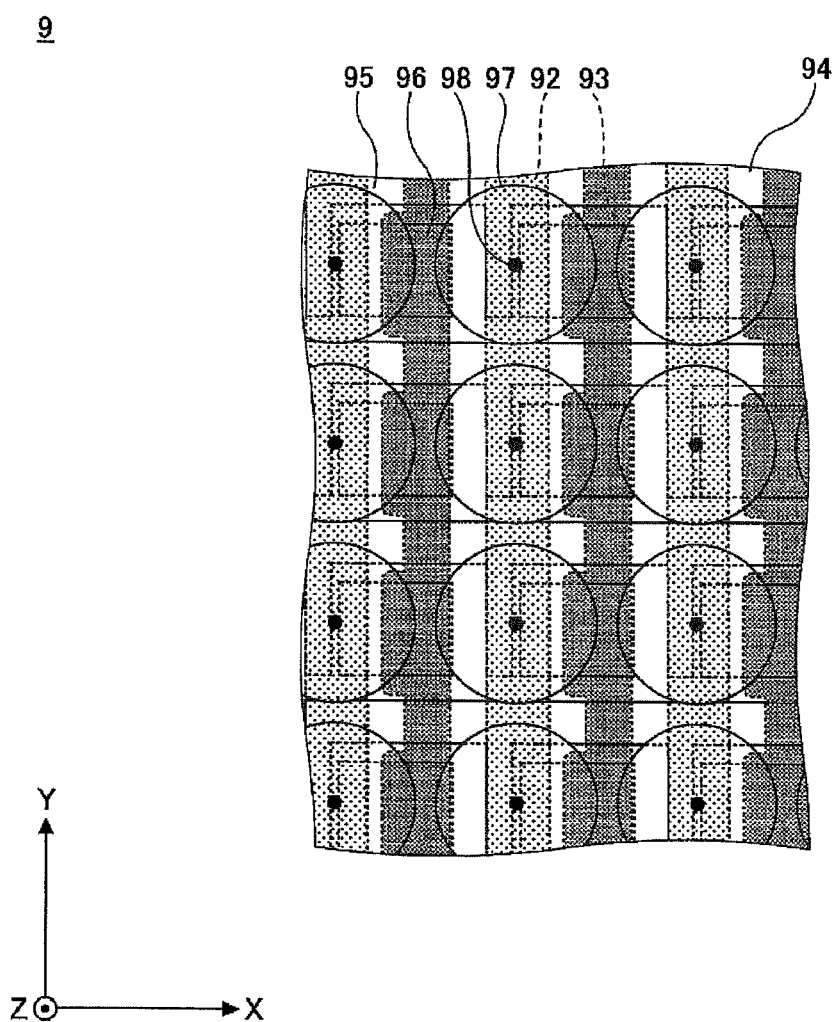
FIG. 8 is a plan view illustrating a center position of a channel region in the conventional organic thin film transistor array.

FIG. 8 is a plan view illustrating a center position of a channel region in the conventional organic thin film transistor array. A conventional organic thin film transistor array 9 illustrated in FIG. 8 includes a gate electrode 92, a ground electrode 93, a gate insulator layer 94, a source electrode 95, a drain electrode 96, and an organic semiconductor layer 97. An approximate center of a channel region is denoted by a reference numeral 98.

In the conventional organic thin film transistor array 9, the gate electrode 92 and the ground electrode 93 are formed on a substrate (not illustrated) at a predetermined distance from each other. The gate insulator layer 94 is formed to cover the gate electrode 92 and the ground electrode 93. The source electrode 95 and the drain electrode 96 are formed on the gate insulator layer 94 at a predetermined distance from each other.

The source electrode 95 and the drain electrode 96 are formed at a position such that a region (channel region) sandwiched between the source electrode 95 and the drain electrode 96 overlaps the gate electrode 92 via the gate insulator layer 94. The organic semiconductor layer 97 is formed so as to cover the region (channel region) sandwiched between the source electrode 95 and the drain electrode 96. A section of the conventional organic thin film transistor array 9 has a rectangular shape. For this reason, unlike the center positions 25 illustrated in FIG. 7, center positions 98 of the channel regions each sandwiched between the source electrode 95 and the drain electrode 96 are aligned along a single straight line in the direction X and along a single straight line in the direction Y.

Figure 9B:
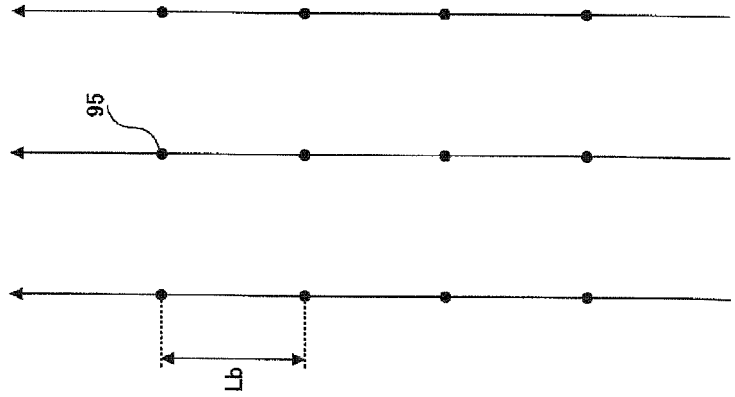
FIGS. 9A and 9B respectively are diagrams for explaining jetting of ink drops by the ink jet method.
Figure 9A:
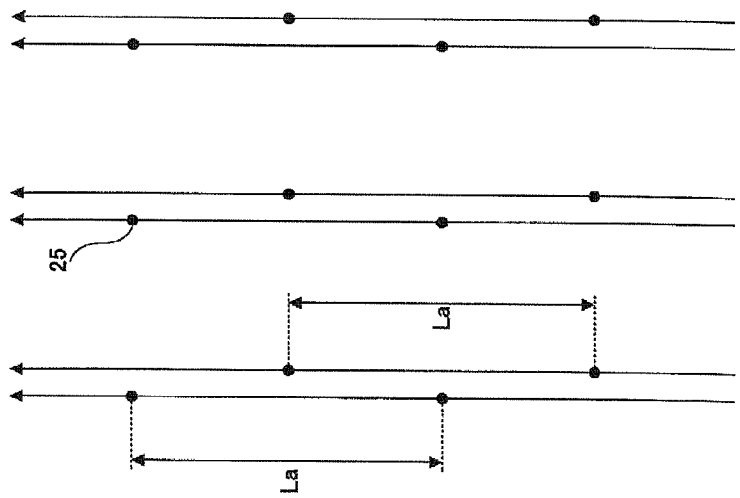

FIGS. 9A and 9B respectively are diagrams for explaining jetting of ink drops by the ink jet method. FIG. 9A is a diagram for explaining the method of jetting the ink drop at the center position 25 of the channel region in the organic thin film transistor array 1 of this first embodiment of the present invention. FIG. 9B is a diagram for explaining the method of jetting the ink drop at the center position 98 of the channel region in the conventional organic thin film transistor array 9. In FIGS. 9A and 9B, arrows indicate the head scan direction of the nozzle which jets the ink drop by the ink jet method. As illustrated in FIGS. 9A and 9B, the nozzle which jets the ink drop scans linearly.

As described above, in the organic thin film transistor array 1 of this first embodiment of the present invention, the center positions 25 of the channel regions are not aligned along the single straight line in the direction Y. For this reason, as illustrated in FIG. 9A, when the ink drop that becomes the organic semiconductor layer 17 lands at the center position 25 of the channel region, it is possible to make a layer forming interval La between the sections forming the adjacent single pixels long.

On the other hand, in the conventional organic thin film transistor array 9, the center positions 98 of the channel regions are aligned along the single straight line in the direction X and along the single straight line in the direction Y, as described above. For this reason, as illustrated in FIG. 9B, when the ink drop that becomes the organic semiconductor layer 97 lands at the center position 98 of the channel region, a layer forming interval Lb between the sections forming the adjacent single pixels becomes short compared to the layer forming interval La.

When the layer forming interval Lb is short, the patterning margin of the organic semiconductor layer 97 becomes small, and the organic semiconductor layer 97 is more easily formed at a portion other than the desired region. In other words, the ink jet method successively jets the ink drops that form the organic semiconductor layer 97 with respect to the sections (adjacent pixels) forming the consecutive single pixels in the head scan direction (direction Y), and thus, the ink drops uneasily dry after landing on the substrate and easily spread, thereby making it difficult to pattern the organic semiconductor layer 97. As a result, a rise in the off leak current and the crosstalk are easily generated, to make it difficult to obtain satisfactory transistor characteristics. In addition, because the interval of the gate electrode 92 and the ground electrode 93 provided at the same layer and the interval of the source electrode 95 and the drain electrode 96 provided at the same layer become narrow, the adjacent electrodes may become short-circuited when these electrode are formed by the printing process.

In the case of the conventional organic thin film transistor array 9 illustrated in FIG. 9B, the ink drops may be jetted discontinuously (or, intermittently at every other center position 98 in the direction Y) in order to make the layer forming interval Lb longer. However, it will become necessary to scan the same position a plurality of times, which in turn increases the time required to make the ink jet process, reduces the productivity due to deteriorated throughput, and increases the fabrication cost. But according to the structure of the organic thin film transistor array 1 of this first embodiment of the present invention, it is possible to make the layer forming interval La long without reducing the productivity. Furthermore, according to the structure of the organic thin film transistor array 1 of this first embodiment of the present invention, it is possible to increase the drying speed of the ink drop and the spreading of the ink drop after landing on the substrate, and the organic semiconductor layer 17 can be patterned with ease.

Moreover, suppressing the spreading of the ink drop after landing on the substrate also has the effect of suppressing the organic semiconductor layer 17 from becoming extremely thin (that is, too thin). In addition, it is possible to minimize the possibility of the organic semiconductor layer 17 becoming uneven in thickness or becoming discontinuous as in the case of a coffee stain shape. This means that the ink concentration of the organic semiconductor material used for the organic semiconductor layer 17 can be reduced, thereby making it possible to reduce the amount of the organic semiconductor material used and reduce the cost.

Next, a description will be given of materials forming each of the constituent elements of the organic thin film transistor array 1. In the organic thin film transistor array 1, the substrate 11 may be formed by a glass substrate or a film substrate. The film substrate may be formed by a polyimide (PI) substrate, a polyether sulfone (PES) substrate, a polyethylene terephthalate (PET) substrate, a polyethylene naphthalate (PEN) substrate or the like.

The organic semiconductor layer 17 is preferably formed and patterned using an organic semiconductor ink that is obtained by dissolving an organic semiconductor material into an organic solvent. Organic semiconductor materials soluble into the organic solvent are not limited to particular materials, and include polymer materials, oligomer materials, low molecular material and the like. For example, the organic semiconductor materials may be an organic low molecular material such as pentacene, anthracene, tetrazene and phthalocyanine; polyacethylene conductor polymer material, polyphenylene conductor polymer material such as polyparaphenylene and its derivatives, and polyphenylene vinylene and its derivatives; heterocyclic polymer material such as polypyrrole and its derivatives, polythiophene and its derivatives, and polyflan and its derivatives; and ionic conductor polymer such as polyanilene and its derivatives.

By using the polymer material, the oligomer material or the low molecular material that is soluble into the organic solvent as the organic semiconductor material, it is possible to perform the patterning process using the printing method such as the ink jet method. In addition, by combining the structure in accordance with this embodiment of the present invention with the organic semiconductor material, it is possible to further simplify the fabrication process and reduce the cost.

Figure 10:
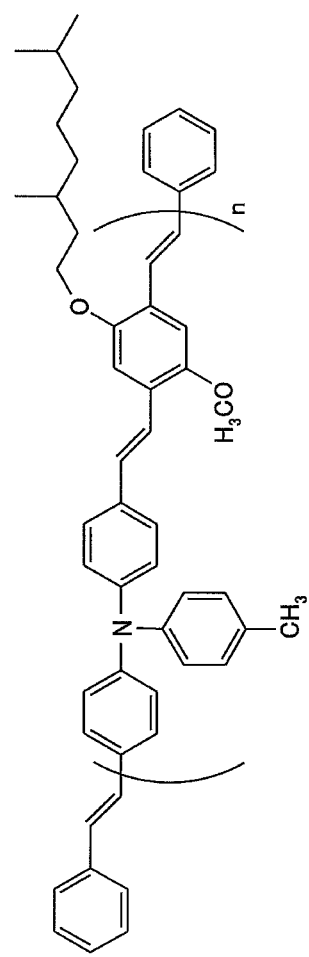
FIG. 10 is a diagram illustrating a chemical structural formula of a polymer material.

Polymer materials having the triarylamine structure are particularly preferable for use as the organic semiconductor material. Such polymer materials are not limited to a particular material, and a material represented by a chemical structural formula illustrated in FIG. 10 may be used. FIG. 10 is a diagram illustrating the chemical structural formula of the polymer material. This polymer material illustrated in FIG. 10 is a non-aligning polymer material, and the inconsistencies in the properties of this material are extremely small regardless of the method and shape with which a layer of this material is formed.

At least one of the gate electrode 12, the source electrode 15 and the drain electrode 16 may be formed and patterned by the printing method such as the dispenser method. Preferably, metal ink including metal particles or metal complexes is used in this case. The metal particles are not limited to a particular metal particle, and it is possible to use a metal selected from a group consisting of Au, Ag, Cu, Pt, Pd, Ni, Ir, Rh, Co, Fe, Mn, Cr, Zn, Mo, W, Ru, In and Sn or, a combination of two or more metals of this group.

From the point of view of the electrical resistance, the thermal conductivity and corrosion resistance, it is possible to select the metal particles from a group consisting of Au, Ag, Cu and Ni or, to select a combination of two or more metals of this group. The metal particles in these cases have an average particle diameter of approximately several nm to approximately several tens of nm, and it is known that when such metal particles are uniformly dispersed within the solvent, the metal particles can be sintered at a considerably lower temperature because the effects of highly active surface atoms become larger as the particle diameter of the metal particles decreases. The metal complex is not limited to a particular metal complex, and may be a metal complex having a metal selected from a group consisting of Au, Pt, Ag, Cu, Pd, In, Cr and Ni as the center metal thereof. It is possible to form the gate electrode 12, the source electrode 15 and the drain electrode 15 by using the metal ink described above and subjecting the metal ink to a sintering after the patterning.

If the surface tension or the viscosity of the metal ink is unsuited for the ink jet method, the ink drop does not easily form a round drop due to clogging or unstable ink jetting. Furthermore, the ligament may become long. For this reason, the metal ink preferably has a surface tension of approximately 30 mN/m and a viscosity of 2 mPa·s to 13 mPa·s, where "s" in "mPa·s" denotes "second". More preferably, the metal ink has a viscosity of 7 mPa·s to 10 mPa·s. The metal ink also needs to have a suitable drying property so that the metal particle or metal complex does not solidify due to volatilization of the solvent when the metal ink is jetted.

In addition, when forming the electrode such as the gate electrode 12, the source electrode 15 and the drain electrode 16, it is possible to use a dispersion liquid of the conductive polymer. The conductive polymer includes polythiophene, polyaniline, polypyrrole, polyparaphenylene, polyacetylene, and any one of such polymers that is doped. From the point of view of the electrical conductivity, stability and heat resistance, the complex (PEDOT/PSS) of polyethylene dioxithiophene (PEDOT) polystyrene sulfonic acid (PSS) is preferable for use as the conductive polymer. Compared to metals, the conductive polymer has a poorer electrical characteristics and stability, but the electrical characteristics of the electrodes can be improved by polymerization and structure, and the electrodes can be formed at a low temperature because no sintering is required.

In the organic thin film transistor array 1 of this first embodiment of the present invention, the organic thin film transistor array 1 is sectioned into the plurality of sections 20 each forming a single pixel. The section 20 has a geometrically closest packed structure, that is, a hexagonal shape in the plan view. In addition, the sections 20 are arranged in a checker board pattern along the direction Y in the plan view. For this reason, it is possible to set the repetition period of the repeating pattern long with respect to the resolution. As a result, the interval between the gate electrode 12 and the ground electrode 13 that are formed at the same layer and the interval between the source electrode 15 and the drain electrode 16 that are formed at the same layer can be made longer, thereby making it possible to suppress the problem of adjacent electrodes becoming short-circuited when the above electrodes are formed by the printing process, without increasing the number of fabrication processes. In addition, because the pattern pitch A is long, it is possible to employ an electrode structure that takes into consideration the spreading of the ink drop or, the inconsistent landing of the ink drops of the organic semiconductor ink forming the organic semiconductor layer 17 on a target surface. In other words, the organic semiconductor layer 17 can be suppressed from being formed in regions other than the desired region, and it is possible to suppress a deterioration in the contrast ratio caused by an increase in an off leak current or a crosstalk between the adjacent organic thin film transistors 10.

Second Embodiment

Figure 11:
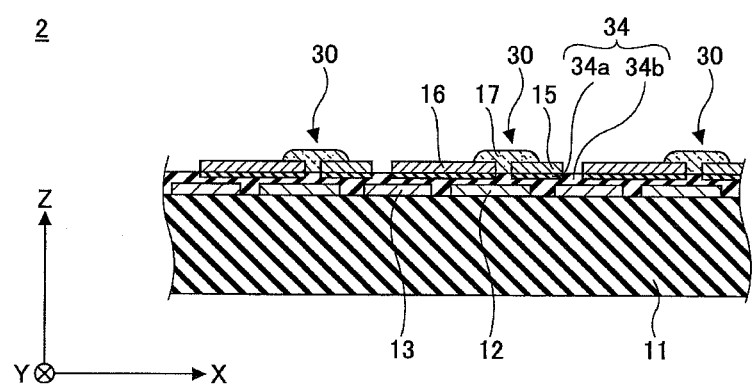
FIG. 11 is a cross sectional view illustrating an organic thin film transistor array in a second embodiment of the present invention.

In a second embodiment of the present invention, a wettability varying layer is used as the gate insulator layer. FIG. 11 is a cross sectional view illustrating an organic thin film transistor array in this second embodiment of the present invention. In FIG. 11, those parts that are the same as those corresponding parts in FIG. 2 are designated by the same reference numerals, and a description thereof will be omitted. Because a plan view of the organic thin film transistor array of this second embodiment of the present invention is the same as that illustrated in FIG. 1, an illustration thereof will be omitted.

As illustrated in FIG. 11, an organic thin film transistor array 2 has a gate insulator layer 34 which replaces the gate insulator layer 14 of the organic thin film transistor array 1. Otherwise, the structure of the organic thin film transistor array 2 is the same as that of the organic thin film transistor array 1. The organic thin film transistor array 2 is formed by a plurality of organic thin film transistors 30. In the following, a description will be given of the structure of the organic thin film transistor array 2 different from that of the organic thin film transistor array 1.

In the organic thin film transistor array 2 illustrated in FIG. 11, the gate insulator layer 34 is formed by a wettability varying layer that includes a high surface energy part 34a and a low surface energy part 34b. The wettability varying layer includes a material whose critical surface tension (or surface free energy) varies when applied with energy such as heat, ultraviolet ray, electron beam and plasma. The high surface energy part 34a has a high critical surface tension (or surface free energy) by being applied with the energy such as the heat, ultraviolet ray, electron beam and plasma. This high surface energy part 34a is formed only in a vicinity of the surface of the wettability varying layer.

On the other hand, the critical surface tension (or surface free energy) of the low surface energy part 34b remains unchanged by not being applied with the energy such as heat, ultraviolet ray, electron beam and plasma. The high surface energy part 34a, which has the higher critical surface tension (or surface free energy) than the low surface energy part 34b, is more lyophilic than the low surface energy part 34b. Hence, it is possible to positively form predetermined conductor layers, such as the source electrode 15, only on the high surface energy part 34a.

The source electrode 15 and the drain electrode 16 are formed at a predetermined distance from each other on the high surface energy part 34a forming the wettability varying layer. The source electrode 15 and the drain electrode 16 are formed at a position such that a region (channel region) sandwiched between the source electrode 15 and the drain electrode 16 overlaps the gate electrode 12 via the gate insulator layer 34. The organic semiconductor layer 17 is formed so as to cover the region (channel region) sandwiched between the source electrode 15 and the drain electrode 16. The gate electrode 12, the source electrode 15, the drain electrode 16, and the organic semiconductor layer 17 may be formed by a printing method such as the ink jet method.

By forming the source electrode 15 and the drain electrode 16 on the high surface energy part 34a of the wettability varying layer forming the gate insulator layer 34, it becomes possible to clearly separate or define a boundary line between the high surface energy part 34a and the low surface energy part 34b. As a result, it is possible to directly plot highly accurate electrode patterns by the printing method such as the ink jet method and the dispenser method. In addition, it is possible to shorten the channel length of the channel region sandwiched between the source electrode 15 and the drain electrode 16.

As described above, the energy such as the heat, ultraviolet ray, electron beam and plasma must be applied to form the high surface energy part 34a. From the point of view of forming extremely small patterns, it is desirable to apply the energy by the ultraviolet ray or the electron beam. However, if the wettability varying layer is made of an organic material and the electron beam is applied, the organic material is easily damaged by the electron beam and the insulation may deteriorate. In addition, the use of the electron beam requires a vacuum apparatus and the throughput is poor. On the other hand, when the ultraviolet ray is applied, the wettability varying layer is less likely damaged and the insulation is less likely to deteriorate. In addition, the use of the ultraviolet ray enables a one-shot exposure in atmosphere, and a more desirable process can be performed because the throughput is high. In a case where the ultraviolet ray is used, the interval between adjacent high surface energy parts 34a can be reduced to approximately 1 µm to approximately 5 µm.

The wettability varying layer may be formed by a single layer that is a mixture of a plurality of materials or, by a single layer that is made of one kind of material. Of course, the wettability varying layer may be formed by two or more layers, that is, may have a multi-layer structure. In the case of the multi-layer structure, a first layer may be made of a material which improves the relative electrical insulation, and a second layer may be made of a material which displays a relatively large change in surface free energy when applied with energy such as the ultraviolet ray, so that functions of each of the layers forming the multi-layer structure are separate. On the other hand, in the case of the single-layer structure, a material which improves the electrical insulation and a material which displays a relatively large change in surface free energy when applied with energy such as ultraviolet ray may be mixed, so that the single-layer structure formed by the mixture displays a distribution in a direction taken along a thickness of the single-layer structure by utilizing the different physical properties of the two materials in the mixture.

The wettability varying layer may be formed by an inorganic material or an organic material. However, the organic material is more suited for using the printing method in order to fabricate inexpensive devices. In order to improve the insulation, the organic material may be added with a small amount of inorganic material. When forming the wettability varying layer on the insulator layer, the wettability varying layer is desirably made of a material having an absorption coefficient larger than that of the insulator material used for the insulator layer, in order to prevent the insulator layer from being affected by the ultraviolet ray that is applied.

Organic materials that may be used as the material for improving insulation include polyimide, polyamideimide, epoxy resin, silsesquioxane, polyvinyl phenol, polyvinyl alcohol, polycarbonate, fluorine rein, polyparaxylylene, and polyvinyl butyral, and polyvinyl phenol and polyvinyl alcohol may be crosslinked. Inorganic materials that may be used as the material for improving insulation include $TiO_2$ and $SiO_2$.

The material which displays the relatively large change in surface free energy when applied with energy such as the ultraviolet ray is desirably a polymer material, and more desirably a polymer material having a hydrophobic base as the side chain. By having the hydrophobic base as the side chain, the polymer material has a low surface free energy in the portion not applied with the ultraviolet ray, and the lyophilic or repellent contrast after the ultraviolet ray irradiation can be made large.

In this embodiment, the material whose critical surface tension (or surface free energy) varies when applied with the ultraviolet ray has a rigid structure even when cut to a certain extent. Accordingly, by introducing polyimide having the satisfactory filling as the principal chain, the moisture absorption does not become very high and the insulation becomes satisfactory, thereby making it possible to form a stacked structure having a high reliability. The polyimide includes thermosetting polyimide which is obtained due to dehydration and condensation reaction by heating polyamic acid, and soluble polyimide that is soluble into a solvent.

A layer of the soluble polyamide may be formed by coating a coating liquid that is dissolved into a solvent, and causing the solvent to volatilize at a low temperature of less than 200° C. On the other hand, when forming a layer of the thermosetting polyimide, the thermosetting polyimide must be heated to a high temperature at which the dehydration and condensation reaction occurs, that is, a temperature of 200° C. or higher in general. Therefore, either one of the thermosetting polyimide and the soluble polyimide may be used depending on the fabrication process employed. By using polyimide for the surface energy varying layer, high and stable insulation is obtained even though the moisture absorption is approximately 2%, and it is possible to control the wettability (or wetting property) while maintaining the highly reliable insulation.

The wettability varying layer preferably has a thickness of 30 nm to 3 μm, and more preferably has a thickness of 50 nm to 1 μm. If the thickness of the wettability varying layer is less than 30 nm, the bulk properties (insulation, gas barrier properties, moisture barrier properties, etc.) may be lost. On the other hand, if the thickness of the wettability varying layer is greater than 3 μm, the surface shape or configuration may deteriorate.

In order to form the portion irradiated with the ultraviolet ray and the portion not irradiated with the ultraviolet ray on the wettability varying layer, a photomask (not illustrated) having apertures with a predetermined shape and corresponding to the source electrodes 15 and the like may be prepared, and ultraviolet ray having a wavelength of 300 nm or less may be irradiated from a super-high pressure mercury lamp (not illustrated) onto the wettability varying layer via the photomask. The portion of the wettability varying layer irradiated with the ultraviolet ray becomes the high surface energy part 34a, while the portion not irradiated with the ultraviolet ray becomes the low surface energy part 34b.

According to the organic thin film transistor array 2 of this second embodiment of the present invention, it is possible to obtain effects similar to those obtainable by the organic thin film transistor array 1 of the first embodiment of the present invention described above. In addition, by forming the gate insulator layer 34 by the wettability varying layer and forming the source electrode 15 and the drain electrode 16 on the high surface energy part 34a of the wettability varying layer, it becomes possible to clearly separate or define the boundary line between the high surface energy part 34a and the low surface energy part 34b. As a result, it is possible to shorten the channel length of the channel region sandwiched between the source electrode 15 and the drain electrode 16.

Third Embodiment

Figure 12:
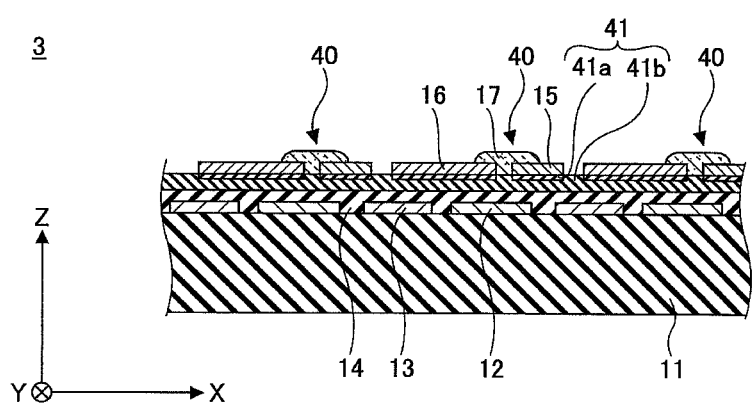
FIG. 12 is a cross sectional view illustrating an organic thin film transistor array in a third embodiment of the present invention.

In a third embodiment of the present invention, a wettability varying layer is formed on the gate insulator layer. FIG. 12 is a cross sectional view illustrating an organic thin film transistor array in this third embodiment of the present invention. In FIG. 12, those parts that are the same as those corresponding parts in FIG. 2 are designated by the same reference numerals, and a description thereof will be omitted. Because a plan view of the organic thin film transistor array of this third embodiment of the present invention is the same as that illustrated in FIG. 1, an illustration thereof will be omitted.

As illustrated in FIG. 12, an organic thin film transistor array 3 has a wettability varying layer 41 formed on the gate insulator layer 14 of the organic thin film transistor array 1. Otherwise, the structure of the organic thin film transistor array 3 is the same as that of the organic thin film transistor array 1. The organic thin film transistor array 3 is formed by a plurality of organic thin film transistors 40. In the following, a description will be given of the structure of the organic thin film transistor array 3 different from that of the organic thin film transistor array 1.

In the organic thin film transistor array 3 illustrated in FIG. 12, the wettability varying layer 41 includes a high surface energy part 41a and a low surface energy part 41b. The wettability varying layer 41 includes a material whose critical surface tension (or surface free energy) varies when applied with energy such as heat, ultraviolet ray, electron beam and plasma. The high surface energy part 41a has a high critical surface tension (or surface free energy) by being applied with the energy such as the heat, ultraviolet ray, electron beam and plasma. This high surface energy part 41a is formed only in a vicinity of the surface of the wettability varying layer 41.

On the other hand, the critical surface tension (or surface free energy) of the low surface energy part 41b remains unchanged by not being applied with the energy such as heat, ultraviolet ray, electron beam and plasma. The high surface energy part 41a, which has the higher critical surface tension (or surface free energy) than the low surface energy part 41b, is more lyophilic than the low surface energy part 41b. Hence, it is possible to positively form predetermined conductor layers, such as the source electrode 15, only on the high surface energy part 41a.

The source electrode 15 and the drain electrode 16 are formed at a predetermined distance from each other on the high surface energy part 41a forming the wettability varying layer 41. The source electrode 15 and the drain electrode 16 are formed at a position such that a region (channel region) sandwiched between the source electrode 15 and the drain electrode 16 overlaps the gate electrode 12 via the gate insulator layer 14 and the wettability varying layer 41 (low surface energy part 41b). The organic semiconductor layer 17 is formed so as to cover the region (channel region) sandwiched between the source electrode 15 and the drain electrode 16. The gate electrode 12, the source electrode 15, the drain electrode 16, and the organic semiconductor layer 17 may be formed by a printing method such as the ink jet method.

By forming the wettability varying layer 41 on the gate insulator layer 14 and forming the source electrode 15 and the drain electrode 16 on the high surface energy part 41a of the wettability varying layer 41, it becomes possible to clearly separate or define a boundary line between the high surface energy part 41a and the low surface energy part 41b. As a result, it is possible to shorten the channel length of the channel region sandwiched between the source electrode 15 and the drain electrode 16. The details of the wettability varying layer 41 may be the same as the details of the wettability varying layer forming the gate insulator layer 34 in the organic thin film transistor array 2 of the second embodiment of the present invention described above, and a description thereof will be omitted.

According to the organic thin film transistor array 3 of this third embodiment of the present invention, it is possible to obtain effects similar to those obtainable by the organic thin film transistor array 1 of the first embodiment of the present invention described above. In addition, by forming the wettability varying layer 41 on the gate insulator layer 14 and forming the source electrode 15 and the drain electrode 16 on the high surface energy part 41a of the wettability varying layer 41, it becomes possible to clearly separate or define the boundary line between the high surface energy part 41a and the low surface energy part 41b. As a result, it is possible to shorten the channel length of the channel region sandwiched between the source electrode 15 and the drain electrode 16.

Fourth Embodiment

Figure 13:
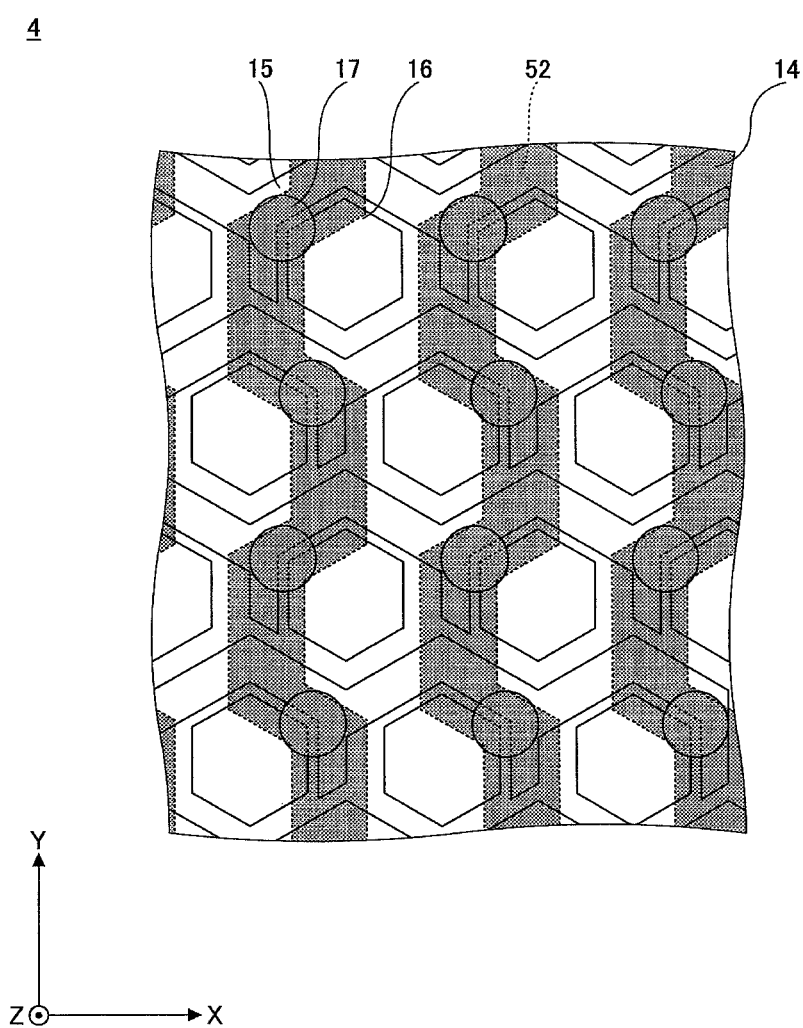
FIG. 13 is a plan view illustrating an organic thin film transistor array in a fourth embodiment of the present invention.

In a fourth embodiment of the present invention, no ground electrode is provided on the substrate. FIG. 13 is a plan view illustrating an organic thin film transistor array in this fourth embodiment of the present invention. In FIG. 13, those parts that are the same as those corresponding parts in FIG. 1 are designated by the same reference numerals, and a description thereof will be omitted.

As illustrated in FIG. 13, an organic thin film transistor array 4 has a gate electrode 52 which replaces the gate electrode 12 of the organic thin film transistor array 1. In addition, the organic thin film transistor array 4 has no ground electrode 13. Otherwise, the structure of the organic thin film transistor array 4 is the same as that of the organic thin film transistor array 1. In the following, a description will be given of the structure of the organic thin film transistor array 4 different from that of the organic thin film transistor array 1.

Because the organic thin film transistor array 4 has no ground electrode 13 provided on the substrate, it is possible to widen the pattern width of the gate electrode 52. In addition, the interval between the adjacent gate electrodes 52 can be set wide. As a result, it is possible to set a large margin with respect to the patterning accuracy.

According to the organic thin film transistor array 4 of this fourth embodiment of the present invention, it is possible to obtain effects similar to those obtainable by the organic thin film transistor array 1 of the first embodiment of the present invention described above. In addition, because no ground electrode 13 is provided on the substrate, the interval between the adjacent gate electrodes 52 can be set wide, and it is possible to set a large margin with respect to the patterning accuracy.

Fifth Embodiment

Figure 14:
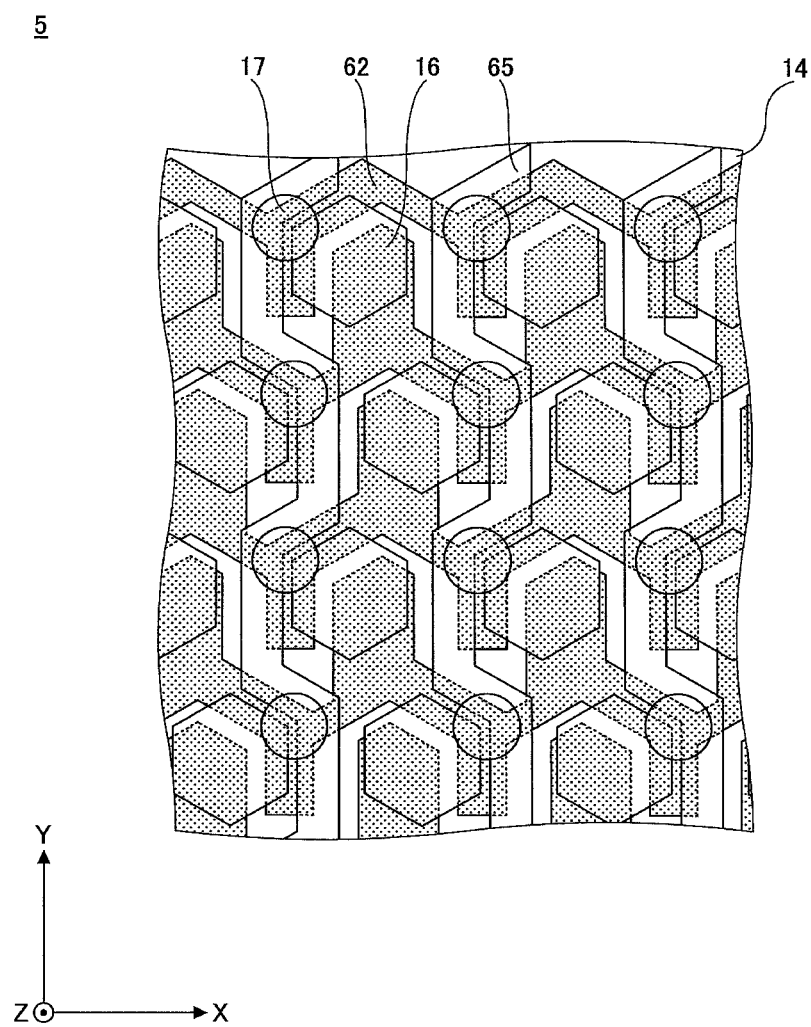
FIG. 14 is a plan view illustrating an organic thin film transistor array in a fifth embodiment of the present invention.

In a fifth embodiment of the present invention, no ground electrode is provided on the substrate, and the gate electrode is used in common as the ground electrode. FIG. 14 is a plan view illustrating an organic thin film transistor array in this fifth embodiment of the present invention. In FIG. 14, those parts that are the same as those corresponding parts in FIG. 1 are designated by the same reference numerals, and a description thereof will be omitted.

As illustrated in FIG. 14, an organic thin film transistor array 5 has a gate electrode 62 and a source electrode 65 which respectively replace the gate electrode 12 and the source electrode 15 of the organic thin film transistor array 1. In addition, the organic thin film transistor array 5 has no ground electrode 13. Otherwise, the structure of the organic thin film transistor array 5 is the same as that of the organic thin film transistor array 1. In the following, a description will be given of the structure of the organic thin film transistor array 5 different from that of the organic thin film transistor array 1.

Although no ground electrode 13 is provided on the substrate in the organic thin film transistor array 5, the gate electrode 62, which corresponds to the gate electrode 12 adjacent to the ground electrode 13 of the organic thin film transistor array 1, also functions as a ground electrode. In other words, a common electrode functions as both the ground electrode and the gate electrode. By providing the gate electrode 62 having such a structure, it becomes unnecessary to take into consideration the interval between the gate electrode and the ground electrode to be formed at the same layer. As a result, it is possible to set a large margin with respect to the patterning accuracy.

According to the organic thin film transistor array 5 of this fifth embodiment of the present invention, it is possible to obtain effects similar to those obtainable by the organic thin film transistor array 1 of the first embodiment of the present invention described above. In addition, because no ground electrode 13 is provided on the substrate, and the gate electrode 62, which corresponds to the gate electrode 12 adjacent to the ground electrode 13 of the organic thin film transistor array 1, also functions as a ground electrode, it becomes unnecessary to take into consideration the interval between the gate electrode and the ground electrode to be formed at the same layer. Consequently, it is possible to set a large margin with respect to the patterning accuracy.

Sixth Embodiment

In a sixth embodiment of the present invention, a display device uses as an active matrix element an active matrix substrate having the organic thin film transistor array 2 of the second embodiment of the present invention described above.

Figure 15:
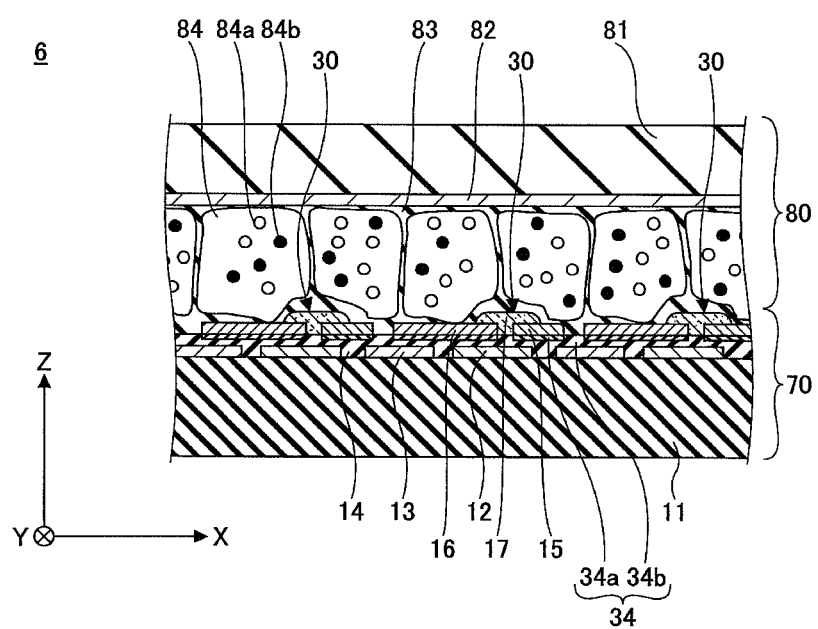
FIG. 15 is a cross sectional view illustrating an example of a display device in accordance with the present invention.

FIG. 15 is a cross sectional view illustrating an example of this display device in accordance with the present invention. In FIG. 15, those parts that are the same as those corresponding parts in FIG. 11 are designated by the same reference numerals, and a description thereof will be omitted.

As illustrated in FIG. 15, a display device 6 has a microcapsule sheet 80 bonded on one surface of an active matrix substrate 70 provided with the organic semiconductor layer 17 and the like.

The active matrix substrate 70 includes the organic thin film transistor array 2, and a protection layer (not illustrated) made of polyparaxylylene is formed on the organic thin film transistor array 2. The microcapsule sheet 80 includes an opposing substrate 81, a transparent conductor layer 82, an urethane resin solution 83, and microcapsules 84. The transparent conductor layer 82 made of indium tin oxide (ITO) is formed on one surface of the opposing substrate 81 made of polyethylene naphthalate. Further, the microcapsules 84 are dispersed within the urethane resin solution 83. The microcapsules 84 are formed by display elements having titanium oxide 84a and carbon black 84b.

A driver Integrated Circuit (IC, not illustrated) for scanning signals is connected to a bus line (not illustrated) connecting to the gate electrode 12 of the display device 6, and a driver IC (not illustrated) for data signals is connected to a bus line (not illustrated) connecting to the source electrode 15 of the display device 6. A still image may be displayed on the display device 6 by switching the image at predetermined time intervals.

Next, a description will be given of an example of a method of fabricating the display device 6. First, Ag ink in which Ag particles are dispersed is used for the printing by the ink jet method, in order to form the gate electrode (scan line or wiring) 12 and the ground electrode 13 on the substrate 11 made of glass or a film. Then, polyamide acid is coated on the gate electrode 12 and the ground electrode by spin-coating, and a sintering is performed in order to form the gate insulator layer 34 that is formed by the wettability varying layer.

Next, a photomask having apertures corresponding to positions where the source electrode 15 and the drain electrode 16 are to be formed is prepared. This photomask that is prepared is placed on the gate insulator layer 34, and ultraviolet ray is irradiated via the photomask in order to form the high surface energy part 34a in the vicinity of the surface of the gate insulator layer 34. Thereafter, Ag ink in which Ag particles are dispersed is used for the printing by the ink jet method, in order to form the source electrode 15 and the drain electrode (signal line or wiring) 16 on the high surface energy part 34a. In addition, organic semiconductor ink is used for printing by the ink jet method, in order to form the organic semiconductor layer 17. Next, a protection layer (not illustrated) made of polyparaxylylene is formed to a thickness of 2 μm by Chemical Vapor Deposition (CVD), to thereby form the active matrix substrate 70.

On the other hand, an indium tin oxide (ITO) is formed to a thickness of approximately 100 nm by sputtering on the opposing substrate 81 that is made of polyethylene naphthalate, in order to form the transparent conductor layer 82. Then, the active matrix substrate 70 is bonded onto the opposing substrate 81 that is formed with the transparent conductor layer 81, via a silica spacer (not illustrated). Hence, the microcapsules (electrophoretic elements) 84 are encapsulated between the gap, that is, between the opposing substrate 81 and the substrate 11, to thereby form the display device 6. This display device 6 is the so-called electrophoretic display panel.

According to this sixth embodiment of the present invention, it is possible to realize the display device 6 using the organic thin film transistor array 2 of the second embodiment of the present invention. As a result, it is possible to suppress a deterioration in the contrast ratio caused by an increase in an off leak current or a crosstalk between the adjacent organic thin film transistors. Moreover, it is possible to fabricate the display device 6, which is sufficiently compliant or flexible, at a low cost.

Embodiment Sample Emb1

An embodiment sample Emb1 was fabricated in the following manner. That is, the organic thin film transistor array 3 having the structure illustrated in FIG. 11 (and FIG. 1) was fabricated, in which the organic thin film transistor 40 has the hexagonal section 20 forming the single pixel and 30×30 elements (transistors) are arranged in an array. An area occupied by the section 20 forming the single pixel and illustrated in FIG. 4A was set to 200 μm×200 μm, which is the same as an area occupied by the section 21 forming the single pixel and illustrated in FIG. 4B in a comparison example Cmp1 which will be described later. Hence, the pattern pitch A in FIG. 4A of the embodiment sample Emb1 was 215 μm.

Figure 16:
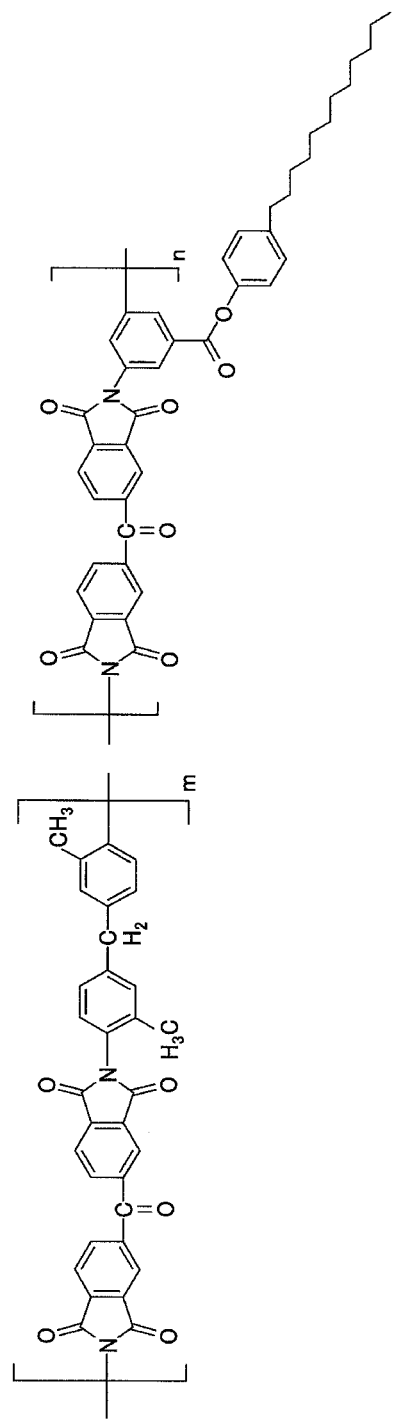
FIG. 16 is a diagram illustrating a chemical structural formula of a polyimide.

First, the gate electrode (scan line) 12 and the ground electrode 13 made of Ag were formed to a thickness of 100 nm on the substrate 11 made of glass, and subjected to a sintering at 280° C. Then, a polyimide, such as RIKACOAT SN-20 manufactured by New Japan Chemical Co., Ltd., was spin-coated on the gate electrode 12 and the ground electrode 13, and subjected to a pre-baking and a sintering at 200° C., in order to form the gate insulator layer 14 having a thickness of 500 nm. Furthermore, a polyimide represented by a chemical structural formula illustrated in FIG. 16 was similarly spin-coated on the gate insulator layer 14, and subjected to a sintering, in order to form the wettability varying layer 41 having a thickness of 100 nm. FIG. 16 is a diagram illustrating the chemical structural formula of the polyimide.

Next, a photomask having aperture patterns corresponding to positions where the source electrode 15 and the drain electrode 16 are to be formed was prepared. Ultraviolet ray having a wavelength of 300 nm or less was irradiated for 15 minutes on the wettability varying layer 41 via the photomask, in order to form the high surface energy part 41a on the wettability varying layer 41. Then, electrode ink was jetted on the high surface energy part 41a by the ink jet method, and subjected to a sintering at 280° C. in order to form the source electrode 15 and the drain electrode 16. An electrode material in which Ag nano-particles are dispersed within an aqueous solution was used as the electrode ink.

In this state, the channel length, that is, the distance between the source electrode 15 and the drain electrode 16 was 5 μm. Next, a solvent in which trimethyl benzene is dissolved in the material represented by the chemical structural formula illustrated in FIG. 10 was printed by the ink jet method on the wettability varying layer 41 having the source electrode (signal line) 15 and the drain electrode formed thereon, in order to form the organic semiconductor layer 17. As a result, the organic thin film transistor array 3 was obtained. A plurality of such organic thin film transistor arrays 3 were fabricated by varying the line width of the source electrode 15.

Comparison Example Cmp1

A comparison example Cmp1 was fabricated in a manner similar to that used to fabricate the embodiment sample Emb1. However, the organic thin film transistor array 9 having the structure illustrated in FIG. 8 was fabricated, in which the organic thin film transistor has the rectangular section 21 forming the single pixel and 30×30 elements (transistors) are arranged in an array. An area occupied by the section 21 forming the single pixel and illustrated in FIG. 4B was set to 200 μm×200 μm, which is the same as an area occupied by the section 20 forming the single pixel and illustrated in FIG. 4A in the embodiment sample Emb1 described above. Hence, the pattern pitch B in FIG. 4B of the comparison example Cmp1 was 200 μm. A plurality of such organic thin film transistor arrays 9 were fabricated by varying the line width of the source electrode 95.

Comparison of Embodiment Sample Emb1 and Comparison Example Cmp1

With respect to the organic thin film transistor arrays 3 and 9 of the embodiment sample Emb1 and the comparison example Cmp1 that were fabricated, the line width of the source electrodes 15 and 95 were varied, and the existence of short-circuiting was evaluated when a voltage is applied across the adjacent source electrodes 15 and 95. Table 1 illustrates the evaluation results that were obtained. In Table 1, a symbol "O" indicates that no short-circuiting was observed, and a symbol "X" indicates that a short-circuiting was observed. As may be seen from Table 1, the wider the line width of each of the source electrodes 15 and 95, the narrower the interval between the adjacent source electrodes 15 and 95, thereby increasing the possibility of generating the short-circuiting. But in the case of the embodiment sample Emb1, the section 20 forming the single pixel has the hexagonal shape and the pattern pitch A is wide in the organic thin film transistor array 3. Hence, it was confirmed that the embodiment sample Emb1 can suppress the generation of the short-circuiting.

TABLE 1

| Line Width (μm) of Source Electrodes 15 & 95 | Embodiment Sample Emb1 | Comparison Example Cmp1 |
|---|---|---|
| 50 | O | O |
| 55 | O | O |
| 60 | O | O |
| 65 | O | O |
| 70 | O | X |
| 75 | O | X |
| 80 | X | X |

Embodiment Sample Emb2

An embodiment sample Emb2 was fabricated in the following manner. That is, the organic thin film transistor array 1 having the structure illustrated in FIGS. 1 and 2 was fabricated, in which the organic thin film transistor 10 has the hexagonal section 20 forming the single pixel and 30×30 elements (transistors) are arranged in an array. An area occupied by the section 20 forming the single pixel and illustrated in FIG. 4A was set to correspond to an area occupied by the rectangular section 21 forming the single pixel and illustrated in FIG. 4B in the organic thin film transistor array 9 of a comparison example Cmp2 which will be described later, with respect to integration densities of 100 pixels per inch (ppi), 127 ppi, 150 ppi and 200 ppi. This is because the integration density (ppi) differs between the rectangular section and the hexagonal section, and in order to compare the integration densities (ppi) of the rectangular and hexagonal sections, it is necessary to normalize the integration density (ppi) by the area occupied by one pixel. Hence, the integration density (ppi) described in the specification generally refers to that for the rectangular section, and the area occupied by the hexagonal section is indicated in terms of the area occupied by the rectangular section having the corresponding integration density (ppi).

First, a bonding layer made of Cr is formed to a thickness of 3 nm on a glass substrate 11, and an Al layer is formed to a thickness of 100 nm by vacuum deposition using a shadow mask, in order to form a gate electrode (scan line) 12 and a ground electrode 13. In addition, a polyparaxylylene insulator layer is formed to a thickness of 500 nm by CVD from a dimonochloroparaxylylene solid dimmer, in order to form a gate insulator layer 14.

Next, an Au layer is formed on the gate insulator layer 14 to a thickness of 50 nm by vacuum deposition using a shadow mask, in order to form a source electrode (signal line) 15 and a drain electrode 16. Then, ink drops are jetted on the gate insulator layer 14 having the source electrode 15 and the drain electrode 16 formed thereon, in order to print an organic semiconductor layer 17 by the ink jet method. As a result, an organic thin film transistor was obtained. A plurality of organic thin film transistor arrays 1 having integration densities of 100 ppi, 127 ppi, 150 ppi and 200 ppi were fabricated.

Comparison Example Cmp2

A comparison example Cmp2 was fabricated in a manner similar to that used to fabricate the embodiment sample Emb2. However, the organic thin film transistor array 9 having the structure illustrated in FIG. 8 was fabricated, in which the organic thin film transistor has the rectangular section 21 forming the single pixel and 30×30 elements (transistors) are arranged in an array. An area occupied by the section 21 forming the single pixel and illustrated in FIG. 4B was set to correspond to the area occupied by the section 20 forming the single pixel and illustrated in FIG. 4A in the organic thin film transistor array 1 of the embodiment sample Emb2, with respect to integration densities of 100 ppi, 127 ppi, 150 ppi and 200 ppi. The pattern pitch B of the rectangular sections 21 each forming the single pixel was 254 μm, 200 μm, 169.3 μm and 127 μm for the organic thin film transistor arrays 9 that were fabricated.

Comparison of Embodiment Sample Emb2 and Comparison Example Cmp2

With respect to the organic thin film transistor arrays 1 and 9 of the embodiment sample Emb2 and the comparison example Cmp2 that were fabricated, the particle diameters of the organic semiconductor layers 17 and 97 that were patterned by the ink jet method were evaluated after drying using a metal microscope. In addition, the off leak current and the crosstalk of the organic thin film transistors were also evaluated.

[Particle Diameters of Organic Semiconductor Layers 17 & 97 After Drying]

Figure 17:
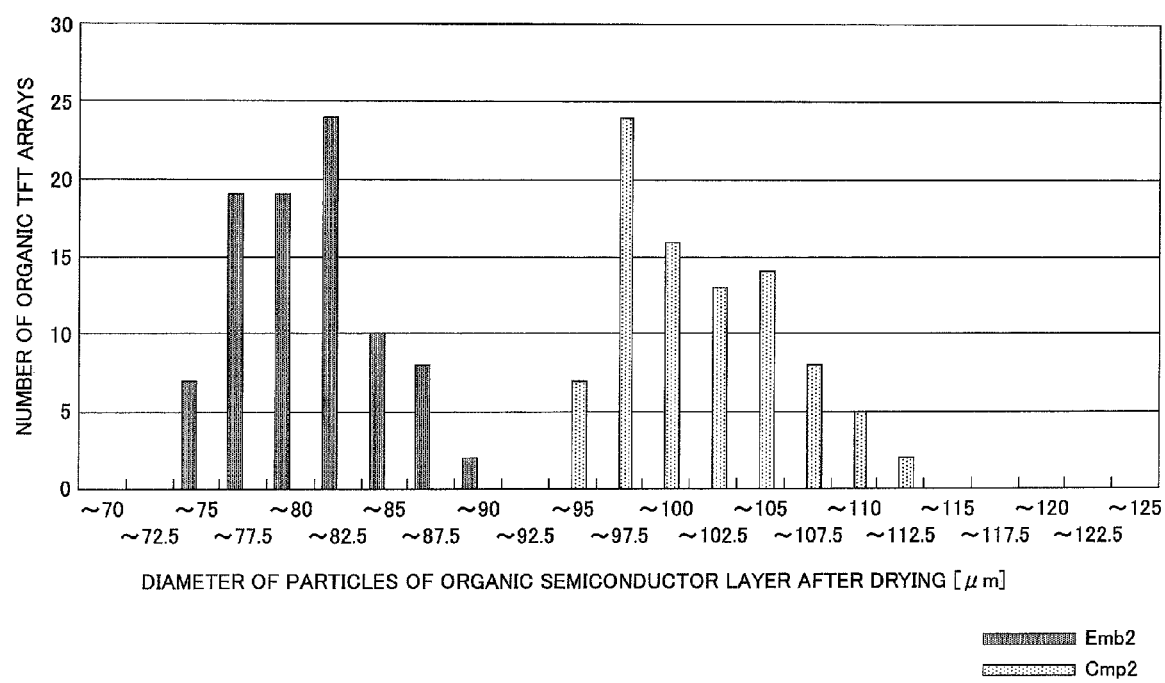
FIG. 17 is a diagram illustrating evaluation results of particle diameters of the organic semiconductor layers after drying using a metal microscope.

FIG. 17 is a diagram illustrating evaluation results of particle diameters of the organic semiconductor layers 17 and 97 after drying using the metal microscope. In FIG. 17, the ordinate indicates the number of organic thin film transistors, and the abscissa indicates the particle diameter of the organic semiconductor layer 17 (embodiment sample Emb2) and the organic semiconductor layer 97 (comparison example Cmp2). In the case of the comparison example Cmp2, the particle diameter of the organic semiconductor layer 97 was approximately 100 μm. On the other hand, the particle diameter of the organic semiconductor layer 17 in the case of the embodiment sample Emb2 having the hexagonal sections 20 forming the single pixel was approximately 80 μm and considerably smaller than that for the comparison example Cmp2. The particle diameters in FIG. 17 refer to the maximum diameters of the particles forming the organic semiconductor layers 17 and 97, and correspond to the maximum diameters φa and φb illustrated in FIGS. 5C and 6C.

The particle diameters of the ink drops which form the organic semiconductor layers 17 and 97 are estimated to be 60 μm to 70 μm at the time of landing on the target surface (or substrate surface). However, in the case of the comparison example Cmp2, the particle diameter of the organic semiconductor layer 97 after the drying is approximately 100 μm, and some of the particle diameters in the process of drying have spread up to approximately two times that at the time of landing on the target surface. On the other hand, in the case of the embodiment sample Emb2, the particle diameter of the organic semiconductor layer 17 after the drying is approximately 80 μm, and the spreading of the particle diameter in the process of drying were suppressed to 10% to 30% that at the time of landing on the target surface. In addition to the pattern pitch A of the embodiment sample Emb2 being wider than the pattern pitch B of the comparison example Cmp2, the landing time interval of the ink drops forming the organic semiconductor layer 17 of the embodiment sample Emb2 becomes longer than that of the ink drops forming the organic semiconductor layer 97 of the comparison example Cmp2. As a result, it was confirmed that the drying of the ink drops after landing on the target surface increases in speed and that the spreading of the ink drops can be suppressed in the case of the embodiment sample Emb2 when compared to the comparison example Cmp2.

In order to realize an integration density of 200 ppi (pitch is conventionally 127 μm) that is considered suitable for display, the ink drops forming the organic semiconductor layer 97 and having the particle diameter of 100 μm after drying will occupy approximately 80% of the area of the single pixel in the case of the comparison example Cmp2. Hence, the required patterning of the organic semiconductor layer 97 is virtually impossible in the case of the comparison example Cmp2. On the other hand, the particle diameter of the ink drops forming the organic semiconductor layer 17 after drying is suppressed to 80 μm in the case of the embodiment sample Emb2, and thus, it is possible to realize a high resolution such as 200 ppi. In order to further confirm the superiority of the embodiment sample Emb2 over the comparison example Cmp2, the off leak current and the crosstalk were also evaluated with respect to the organic thin film transistor array 1 of the embodiment sample Emb2 and the organic thin film transistor array 9 of the comparison example Cmp2.

[Evaluation of Off Leak Current & Crosstalk]

In an atmosphere in which the oxygen is less than 1 ppm and the moisture is less than 1 ppm, a drain voltage Vds of −20 V and a gate voltage Vg of +20 V were applied to the organic thin film transistors of the organic thin film transistor array 1 of the embodiment sample Emb2 and the organic thin film transistor array 9 of the comparison example Cmp2, in order to evaluate the off leak current. In addition, under the same atmosphere, voltages of ±20 V were applied across the adjacent source electrodes 15 and across the adjacent source electrodes 95, in order to evaluate the effects of the crosstalk caused by the spreading of range of each of the organic semiconductor layers 17 and 97. In other words, with respect to the organic thin film transistor arrays 1 and 9 of the embodiment sample Emb2 and the comparison example Cmp2 that were fabricated, the off leak current and the generation of the crosstalk were evaluated by varying the integration density of the organic thin film transistor arrays 1 and 9. Table 2 illustrates the evaluation results that were obtained.

In Table 2, a symbol "O" indicates that no increase in the off leak current was observed and no generation of crosstalk was observed, and a symbol "X" indicates that an increase in the off leak current and generation of the crosstalk were observed. In Table 2, the integration density (ppi) is indicated in relation to that of the comparison example Cmp2. As may be seen from Table 2, it was confirmed that the off leak current increases and the crosstalk is generated when the integration density is 150 ppi or 200 ppi in the case of the comparison example Cmp2. On the other hand, in the case of the embodiment sample Emb2, no increase in the off leak current and no generation of the crosstalk were observed even when the area occupied by the single pixel formed by the hexagonal section of the organic thin film transistor array is the same as the area occupied by single pixel formed by the rectangular section of the organic thin film transistor array having the integration density of 200 ppi. Therefore, it was confirmed that, in addition to the pattern pitch A of the embodiment sample Emb2 being wider than the pattern pitch B of the comparison example Cmp2, the landing time interval of the ink drops forming the organic semiconductor layer 17 of the embodiment sample Emb2 becomes longer than that of the ink drops forming the organic semiconductor layer 97 of the comparison example Cmp2, and for this reason, the drying of the ink drops after landing on the target surface increases in speed and that the spreading of the ink drops can be suppressed in the case of the embodiment sample Emb2 when compared to the comparison example Cmp2. In other words, it was confirmed that the range in which the organic semiconductor layer 17 of the organic thin film transistor array 1 is formed does not spread unnecessarily.

TABLE 2

| Integration Density (ppi) | Embodiment Sample Emb2 | Comparison Example Cmp2 |
|---|---|---|
| 100 | O | O |
| 127 | O | O |
| 150 | O | X |
| 200 | O | X |

Embodiment Sample Emb3

An active matrix display device was fabricated using the organic thin film transistor array 3 fabricated for the embodiment sample Emb1 described above. More particularly, indium tin oxide (ITO) was formed on a film substrate to a thickness of 100 nm by sputtering, in order to fabricate a film substrate having a transparent conductor layer formed thereon.

On the other hand, 20 weight percent (wt. %) of titanium oxide, 1 wt. % of silicone macromer/methacryl copolymer, 2 wt. % of silicone polymer graft carbon black, and 77 wt. % of silicone oil were mixed and dispersed using microwaves for 1 hour, in order to adjust a black-and-white particle dispersion liquid. The black-and-white particle dispersion liquid was formed into microcapsules using gelatin-gum arabic complex coacervation method. The average particle diameter of the microcapsules was approximately 60 μm. Next, the blade-coat method was used to expand the dispersion liquid having the microcapsules dispersed within an urethane resin solution on the film substrate having the transparent conductor layer formed thereon, in order to fabricate a microcapsule sheet.

The microcapsule sheet was bonded on an active matrix substrate, in order to fabricate an electrophoretic display panel. A driver IC for scanning signals was connected to a bus line connecting to the gate electrode of the active matrix display device, and a driver IC for data signals was connected to a bus line connecting to the source electrode of the active matrix display device. When the image was switched for every 0.5 second, a satisfactory still image was displayed on the active matrix display device.

Therefore, it was confirmed that the active matrix display device can be realized using the organic thin film transistor array in accordance with the embodiments described above.

For example, in the second and third embodiments described above, the source electrode and the drain electrode are formed on the high surface energy part of the wettability varying layer. However, it is possible to form a wettability varying layer on the substrate, separately or in addition, and form the gate electrode and the ground electrode on a high surface energy part of this wettability varying layer.

In the sixth embodiment described above, the fabricated display device is the so-called electrophoretic display panel having the organic thin film transistor array in accordance with the embodiments described above and the electrophoretic elements that form the display elements. However, it is of course possible to form the so-called liquid crystal display panel having the organic thin film transistor array in accordance with the embodiments described above and liquid crystal elements that form the display elements. It is also possible to form the so-called organic electro-luminescence (OEL) display panel having the organic thin film transistor array in accordance with the embodiments described above and OEL elements that form the display elements. For example, polyamide acid is spin-coated on the transparent conductor layer 82 illustrated in FIG. 14 and subjected to a rubbing to form an alignment (or orientation) layer having a thickness of approximately 200 nm, and then, an alignment process is performed. In addition, the active matrix substrate 70 and the opposing substrate 81 having the alignment layer formed thereon are bonded via a silica spacer. The so-called liquid crystal display panel is fabricated as the display device by encapsulating the liquid crystal material between the gap. Furthermore, by forming the OEL elements on the active matrix substrate 70 and providing an air or atmosphere shielding, the so-called OEL display panel is fabricated as the display device.

Moreover, in the sixth embodiment described above, the described example fabricated the display device 6 using the organic thin film transistor array 2 of the second embodiment of the present invention. However, the display device 6 may be fabricated using any one of the organic thin film transistor arrays 1, 3, 4 and 5 of the first, third, fourth and fifth embodiments of the present invention. The effects obtained by using one of the organic thin film transistor arrays 1, 3, 4 and 5 are the same as those obtainable when the organic thin film transistor array 2 is used.

In addition, in the embodiments described above, the present invention is applied to a bottom gate type organic thin film transistor array having the gate electrode, the gate insulator layer, and the source and drain electrodes successively stacked on the substrate. However, the present invention is of course applicable to a top gate type organic thin film transistor array in which the source and drain electrodes, the gate insulator layer, and the gate electrode are successively stacked on the substrate.

According to the aspects of the present invention and the embodiments of the present invention described above, it is possible to fabricate an organic transistor array having a high integration density by using an existing printing process, without increasing the number of fabrication processes, and to also fabricate a display device having such an organic transistor array.

Further, the present invention is not limited to these embodiments, but various variations and modifications may be made without departing from the scope of the present invention.

What is claimed is:

1. An organic transistor array comprising:
   a plurality of gate electrodes provided on a substrate surface;
   a plurality of source electrodes and a plurality of drain electrodes provided on an opposite side of a gate insulator layer from the plurality of gate electrodes and configured such that portions of the source electrodes are mutually adjacent to portions of the drain electrodes; and
   an organic semiconductor layer opposing the plurality of gate electrodes via the gate insulator layer, the organic semiconductor layer being comprised of dried organic semiconductor ink drops each forming a channel region between respective mutually adjacent source electrode portions and drain electrode portions, the dried ink drops spreading over less than all of the respective mutually adjacent source and drain electrode portions,
   wherein the organic transistor array in a plan view viewed in a direction perpendicular to the substrate surface is sectioned into a plurality of sections,
   each of the sections corresponds to a single pixel, and
   the sections are arranged relative to one another so as to have a closest packed arrangement in the plan view.

2. The organic transistor array as claimed in claim 1, wherein each of the sections has a hexagonal shape in the plan view.

3. The organic transistor array as claimed in claim 1, wherein the plurality of sections are arranged in a checker board pattern such that a channel region of each section of the plurality of section is aligned with a channel region of a first neighboring section along a first direction but the channel region is not aligned with a second neighboring section along a second direction that perpendicular to the first direction.

4. The organic transistor array as claimed in claim 1, wherein the organic semiconductor layer is formed by a printed layer.

5. The organic transistor array as claimed in claim 1, wherein the organic semiconductor layer is made of a material including an organic semiconductor material soluble in an organic solvent.

6. The organic transistor array as claimed in claim 1, wherein at least one of the plurality of gate electrodes, the plurality of source electrodes and the plurality of drain electrodes is formed by a printed layer.

7. The organic transistor array as claimed in claim 1, further comprising:
   a wettability varying layer provided on the gate insulator layer and made of a material whose surface energy varies depending on energy applied thereto,
   said wettability varying layer comprising:
   a first surface energy part; and
   a second surface energy part having a surface energy higher than that of the first surface energy part by being applied with the energy, wherein the plurality of source electrodes and the plurality of drain electrodes are provided on the second surface energy part.

8. The organic transistor array as claimed in claim 7, wherein:
the wettability varying layer includes a first material and a second material;
the first material has an electrical insulation higher than that of the second material; and
the second material has a surface energy which increases at a rate higher than that of the first material when energy is applied thereto.

9. The organic transistor array as claimed in claim 1, wherein:
the gate insulator layer is formed by a wettability varying layer whose surface energy varies depending on energy applied thereto;
the wettability varying layer comprises a first surface energy part, and a second surface energy part having a surface energy higher than that of the first surface energy part by being applied with the energy,
wherein the plurality of source electrodes and the plurality of drain electrodes are provided on the second surface energy part.

10. The organic transistor array as claimed in claim 9, wherein:
the wettability varying layer includes a first material and a second material;
the first material has an electrical insulation higher than that of the second material; and
the second material has a surface energy which increases at a rate higher than that of the first material when energy is applied thereto.

11. The organic transistor array as claimed in claim 1, wherein at least one of the plurality of gate electrodes, the plurality of source electrodes and the plurality of drain electrodes is formed by ink, the ink including metal particles or metal complexes.

12. The organic transistor array as claimed in claim 11, wherein the metal particles are selected from a group consisting of Au, Ag, Cu, Ni and a combination of two or more metals among Au, Ag, Cu and Ni.

13. The organic transistor array as claimed in claim 1, wherein at least one of the plurality of gate electrodes, the plurality of source electrodes and the plurality of drain electrodes includes a conductor polymer material.

14. The organic transistor array as claimed in claim 13, wherein the conductive polymer material includes polyethylene dioxithiophene.

15. The organic transistor array as claimed in claim 1, wherein the gate insulator layer includes a polymer material.

16. A display device comprising:
an organic transistor array comprising:
a plurality of gate electrodes provided on a substrate surface of a first substrate;
a plurality of source electrodes and a plurality of drain electrodes provided on an opposite side of a gate insulator layer from the plurality of gate electrodes and configured such that portions of the source electrodes are mutually adjacent to portions of the drain electrodes; and
an organic semiconductor layer opposing the plurality of gate electrodes via the gate insulator layer, the organic semiconductor layer being comprised of dried organic semiconductor ink drops each forming a channel region between respective mutually adjacent source electrode portions and drain electrode portions, the dried ink drops spreading over less than all of the respective mutually adjacent source and drain electrode portions,
wherein the organic transistor array in a plan view viewed in a direction perpendicular to the substrate surface is sectioned into a plurality of sections,
each of the sections corresponds to a single pixel, and
the sections are arranged relative to one another so as to have a closest packed arrangement in the plan view; and
a display element array bonded on a surface of the organic transistor array opposite from the first substrate, the display element array comprising:
a plurality of display elements and
a transparent conductor layer provided over the plurality of display elements opposite the first substrate.

17. The display device as claimed in claim 16, wherein the display elements are selected from a group consisting of electrophoretic elements, liquid crystal elements, and organic electroluminescence elements.

18. The display device as claimed in claim 16, wherein a stacked structure which includes the organic transistor array and the display element array is flexible.

* * * * *